(12) United States Patent
Shin et al.

(10) Patent No.: US 12,538,621 B2
(45) Date of Patent: Jan. 27, 2026

(54) DISPLAY DEVICE

(71) Applicant: Samsung Display Co., LTD., Yongin-si (KR)

(72) Inventors: Dong Hee Shin, Asan-si (KR); Sun Kwun Son, Suwon-si (KR); Na Hyeon Cha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 945 days.

(21) Appl. No.: 17/707,408

(22) Filed: Mar. 29, 2022

(65) Prior Publication Data

US 2023/0033341 A1 Feb. 2, 2023

(30) Foreign Application Priority Data

Jul. 28, 2021 (KR) .................. 10-2021-0099028

(51) Int. Cl.
*H10H 20/857* (2025.01)
*H10H 20/831* (2025.01)
*H10H 29/14* (2025.01)

(52) U.S. Cl.
CPC ...... *H10H 20/857* (2025.01); *H10H 20/8312* (2025.01); *H10H 29/142* (2025.01)

(58) Field of Classification Search
None
See application file for complete search history.

(56) References Cited

U.S. PATENT DOCUMENTS

| | | | |
|---|---|---|---|
| 2007/0222727 A1* | 9/2007 | Baek | G02F 1/136259 345/87 |
| 2021/0181881 A1* | 6/2021 | You | G06F 3/0446 |
| 2022/0208935 A1* | 6/2022 | Kim | H10D 86/60 |

FOREIGN PATENT DOCUMENTS

| | | |
|---|---|---|
| JP | 2016-071083 A | 5/2016 |
| KR | 2012-0110413 A | 10/2012 |
| KR | 10-2018-0062574 | 6/2018 |
| KR | 10-2033619 B1 | 10/2019 |
| KR | 10-2076839 B1 | 2/2020 |
| KR | 10-2090154 | 3/2020 |
| KR | 10-2020-0088951 | 7/2020 |
| KR | 10-2021-0089565 | 7/2021 |
| KR | 10-2022-0162202 A | 12/2022 |

* cited by examiner

*Primary Examiner* — Bradley Smith
(74) *Attorney, Agent, or Firm* — Womble Bond Dickinson (US) LLP

(57) ABSTRACT

A display device includes a substrate, data lines on the substrate, and extending in a first direction, first gate lines at a same layer as the data lines, and extending in the first direction, second gate lines on the first gate lines, and extending in a second direction crossing the first direction, and cover patterns on the second gate lines, floated, and covering crossing points between the first gate lines and the second gate lines.

17 Claims, 22 Drawing Sheets

DISPLAY DEVICE

CROSS-REFERENCE TO RELATED APPLICATION

This application claims priority to, and the benefit of, Korean Patent Application No. 10-2021-0099028 filed on Jul. 28, 2021, in the Korean Intellectual Property Office, the contents of which in its entirety are herein incorporated by reference.

BACKGROUND

1. Field

The present disclosure relates to a display device.

2. Description of the Related Art

As the information society develops, the demand for display devices for displaying images has increased and diversified. For example, display devices have been applied to various electronic devices, such as smartphones, digital cameras, laptop computers, navigation devices, and smart televisions. The display devices may be flat panel display devices such as liquid crystal display devices, field emission display devices, or organic light emitting display devices. Among such flat panel display devices, a light emitting display device may display an image without a backlight unit providing light to a display panel because each of pixels of the display panel includes a light emitting element that may emit light by itself. The light emitting element may be an organic light emitting diode that uses an organic material as a fluorescent material and an inorganic light emitting diode that uses an inorganic material as a fluorescent material.

SUMMARY

Aspects of the present disclosure provide a display device in which a plurality of unit pixel areas may be recognized to be the same as each other in an optical inspection to secure reliability.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to some embodiments of the disclosure, a display device includes a substrate, data lines on the substrate, and extending in a first direction, first gate lines at a same layer as the data lines, and extending in the first direction, second gate lines on the first gate lines, and extending in a second direction crossing the first direction, and cover patterns on the second gate lines, floated, and covering crossing points between the first gate lines and the second gate lines.

The cover patterns may have a shape of islands spaced from each other in the first direction and the second direction.

The second gate lines may be connected to respective first gate lines through respective contact parts, and are insulated from others of the first gate lines by non-contact parts, wherein the cover patterns overlap the contact parts and the non-contact parts in a thickness direction.

The display device may further include a gate electrode in a layer between the first gate lines and the second gate lines.

The display device may further include first and second electrodes at a same layer as the cover patterns, and extending in the first direction.

The first and second electrodes may be spaced apart from the first gate lines in plan view.

The display device may further include first light emitting elements aligned between the first and second electrodes.

The display device may further include a first contact electrode connected between the first electrode and first ends of the first light emitting elements, and a second contact electrode connected between the second electrode and second ends of the first light emitting elements.

The display device may further include a gate electrode at a same layer as the second gate lines.

The display device may further include first and second electrodes on the cover patterns and extending in the first direction.

The display device may further include pixel circuits of pixels respectively connected to the data lines and the second gate lines, and first voltage lines, initialization voltage lines, and first light emitting elements respectively connected to the pixel circuits.

The pixel circuits may include first transistors respectively connected between the first voltage lines and the first light emitting elements, and configured to supply a driving current to the first light emitting elements, second transistors configured to respectively connect the data lines to first nodes including gate electrodes of the first transistors based on a gate signal of the second gate lines, and third transistors configured to respectively connecting the initialization voltage lines to second nodes including source electrodes of the first transistors based on the gate signal.

According to some embodiments of the disclosure, a display device includes a substrate, data lines on the substrate, and extending in a first direction, first gate lines at a same layer as the data lines, and extending in the first direction, second gate lines on the first gate lines, and extending in a second direction crossing the first direction, first and second electrodes on the second gate lines, and extending in the first direction, and first light emitting elements aligned between the first and second electrodes, wherein at least one of the first and second electrodes includes cover patterns covering crossing points between the first gate lines and the second gate lines.

The cover patterns may protrude from the first electrode or the second electrode in the second direction.

The second gate lines may be respectively connected to the first gate lines through a contact part, and are insulated from others of the first gate lines by non-contact parts, wherein the cover patterns overlap the contact parts and the non-contact parts in a thickness direction.

A portion of the first electrode or the second electrode excluding the cover patterns may be spaced from the first gate lines in plan view.

The display device may further include a gate electrode at a layer between the first gate lines and the second gate lines.

According to some embodiments of the disclosure, a display device includes a substrate, data lines on the substrate, and extending in a first direction, first gate lines at a same layer as the data lines, and extending in the first direction, second gate lines on the first gate lines, and extending in a second direction crossing the first direction, voltage lines on the second gate lines, and extending in the second direction, first and second electrodes on the voltage lines, and extending in the first direction, and first light emitting elements aligned along the first direction between the first and second electrodes, wherein the voltage lines include cover patterns covering crossing points of the first gate lines and the second gate lines.

The cover patterns may protrude from the voltage lines in the first direction.

The second gate lines may be respectively connected to the first gate lines through contact parts, and are insulated from others of the first gate lines by non-contact parts, wherein the cover patterns overlap the contact parts and the non-contact parts in a thickness direction.

With the display devices according to some embodiments, the plurality of cover patterns located above the crossing points between vertical gate lines and horizontal gate lines are included, such that a plurality of unit pixel areas may be recognized to be the same as each other in an optical inspection. Therefore, the display device may secure reliability by normally determining the possibility of a defect in an optical inspection process of the plurality of unit pixel areas.

The aspects of the present disclosure are not limited to the aforementioned aspects, and various other aspects are included in the present specification.

BRIEF DESCRIPTION OF THE DRAWINGS

The above and other aspects of the present disclosure will become more apparent by describing in detail embodiments thereof with reference to the attached drawings, in which.

DETAILED DESCRIPTION

Figure 1:
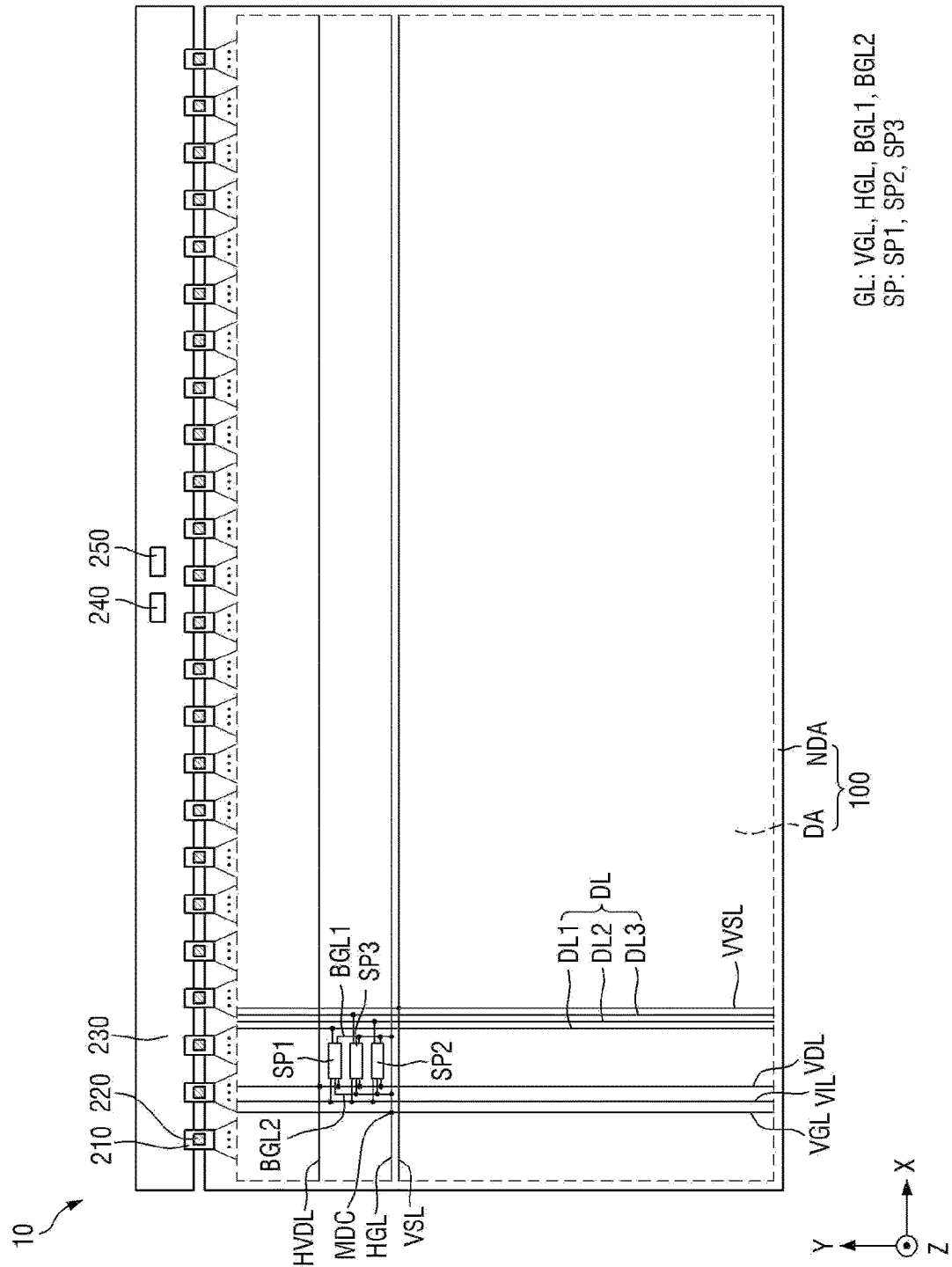
FIG. 1 is a plan view illustrating a display device according to some embodiments.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods employing one or more of the disclosure disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of some embodiments may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When some embodiments may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation, not as terms of degree, and thus are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or overly formal sense, unless clearly so defined herein.

FIG. 1 is a plan view illustrating a display device according to some embodiments.

In the present specification, "upper portion", "top", and "upper surface" refer to an upper direction with respect to a display device, that is, a Z-axis direction, while "lower portion", "bottom" and "lower surface" refer to a lower direction with respect to the display device, that is, an opposite direction to a Z axis. In addition, "left", "right", "upper", and "lower" refer to directions when the display device is viewed in plan view. For example, "left" refers to an opposite direction to an X axis, "right" refers to an X-axis direction, "upper" refers to a Y-axis direction, and "lower" refers to an opposite direction to a Y axis.

Referring to FIG. 1, a display device is a device that displays a moving image or a still image, and may be used as a display screen of various products such as televisions, laptop computers, monitors, billboards, and Internet of Things (IOT) as well as portable electronic devices such as mobile phones, smartphones, tablet personal computers (PCs), smartwatches, watch phones, mobile communication terminals, electronic organizers, electronic books, portable multimedia players (PMPs), navigation devices, and ultra-mobile PCs (UMPCs).

The display device may include a display panel 100, flexible films 210, display drivers 220, a circuit board 230, a timing controller 240, and a power supply unit 250.

The display panel 100 may have a rectangular shape in plan view. For example, the display panel 100 may have a rectangular shape, in plan view, having long sides in a first direction (X-axis direction) and short sides in a second direction (Y-axis direction). A corner where the long side in the first direction (X-axis direction) and the short side in the second direction (Y-axis direction) meet may be right-angled or may be rounded with a curvature (e.g., a predetermined curvature). The shape of the display panel 100 in plan view is not limited to the rectangular shape, and may be other polygonal shapes, a circular shape, or an elliptical shape. For example, the display panel 100 may be formed to be flat, but is not limited thereto. As another example, the display panel 100 may be formed to be bent with a curvature (e.g., a predetermined curvature).

The display panel 100 may include a display area DA and a non-display area NDA.

The display area DA is an area displaying an image, and may be defined as a central area of the display panel 100. The display area DA may include a plurality of pixels SP, gate lines GL, data lines DL, initialization voltage lines VIL, first voltage lines VDL, horizontal voltage lines HVDL, vertical voltage lines VVSL, and second voltage lines VSL. The plurality of pixels SP may be formed in each of pixel areas intersected by a plurality of data lines DL and a plurality of gate lines GL, respectively. The pixel SP may include first to third pixels SP1, SP2, and SP3. Each of the first to third pixels SP1, SP2, and SP3 may be connected to one horizontal gate line HGL and one data line DL. Each of the first to third pixels SP1, SP2, and SP3 may be defined as an area of a minimum unit for emitting light.

The first pixel SP1 may emit light of a first color or red light, the second pixel SP2 may emit light of a second color or green light, and the third pixel SP3 may emit light of a third color or blue light. A pixel circuit of the first pixel SP1, a pixel circuit of the third pixel SP3, and a pixel circuit of the second pixel SP2 may be arranged in an opposite direction to the second direction (Y-axis direction), but the order of the pixel circuits is not limited thereto.

The gate line GL may include a vertical gate line VGL, a horizontal gate line HGL, and first and second auxiliary gate lines BGL1 and BGL2.

A plurality of vertical gate lines VGL may be connected to the display drivers 220, may extend in the second direction (Y-axis direction), and may be spaced apart from each other in the first direction (X-axis direction). The vertical gate line VGL may be a first gate line. The vertical gate lines VGL may be located parallel to the data lines DL. A plurality of horizontal gate lines HGL may extend in the first direction (X-axis direction) and may be spaced apart from each other in the second direction (Y-axis direction). The horizontal gate line HGL may be a second gate line. The plurality of horizontal gate lines HGL may cross the plurality of vertical gate lines VGL, respectively. For example, one horizontal gate line HGL may be connected to one vertical gate line VGL of the plurality of vertical gate lines VGL through a contact part MDC. The contact part MDC may correspond to a portion where the horizontal gate line HGL is inserted into, or connected to a conductive part within, a contact hole to come into contact (e.g., electrical contact) with the vertical gate line VGL. The first and second auxiliary gate lines BGL1 and BGL2 may extend from the horizontal gate line HGL and may supply gate signals to the first to third pixels SP1, SP2, and SP3.

The plurality of data lines DL may extend in the second direction (Y-axis direction) and may be spaced apart from each other in the first direction (X-axis direction). The plurality of data lines DL may include first to third data lines DL1, DL2, and DL3. Each of the first to third data lines DL1, DL2, and DL3 may supply a data voltage to each of the first to third pixels SP1, SP2, and SP3.

A plurality of initialization voltage lines VIL may extend in the second direction (Y-axis direction) and may be spaced apart from each other in the first direction (X-axis direction). The initialization voltage lines VIL may supply initialization voltages received from the display drivers 220 to the pixel circuit of each of the first to third pixels SP1, SP2, and SP3. The initialization voltage lines VIL may receive sensed signals from each of the pixel circuits of the first to third pixels SP1, SP2, and SP3 and may supply the sensed signals to the display drivers 220.

A plurality of first voltage lines VDL may extend in the second direction (Y-axis direction) and may be spaced apart from each other in the first direction (X-axis direction). The first voltage lines VDL may supply a driving voltage or a high potential voltage received from the power supply unit 250 to the plurality of pixels SP.

A plurality of horizontal voltage lines HVDL may extend in the first direction (X-axis direction) and may be spaced apart from each other in the second direction (Y-axis direction). The horizontal voltage lines HVDL may be connected to the first voltage lines VDL. The horizontal voltage lines HVDL may supply a driving voltage or a high potential voltage to the first voltage lines VDL.

The vertical voltage lines VVSL may extend in the second direction (Y-axis direction) and may be spaced apart from each other in the first direction (X-axis direction). The vertical voltage lines VVSL may be connected to the second voltage lines VSL. The vertical voltage lines VVSL may supply a low potential voltage received from the power supply unit 250 to the second voltage lines VSL.

The second voltage lines VSL may extend in the first direction (X-axis direction) and may be spaced apart from each other in the second direction (Y-axis direction). The second voltage lines VSL may supply a low potential voltage to the plurality of pixels SP.

Connection relationships between the plurality of pixels SP, the gate lines GL, the data lines DL, the initialization voltage lines VIL, the first voltage lines VDL, and the second voltage lines VSL may be changed in design according to the number and an arrangement of the plurality of pixels SP.

The non-display area NDA may be defined as an area that is other than the display area DA in the display panel 100. For example, the non-display area NDA may include fan-out lines for connecting the vertical gate lines VGL, the data lines DL, the initialization voltage lines VIL, the first voltage lines VDL, and the vertical voltage lines VVSL to the display drivers 220 and to pad parts connected to the flexible films 210.

Input terminals provided on one sides of the flexible films 210 may be attached to the circuit board 230 by a film attaching process, and output terminals provided on the other sides of the flexible films 210 may be attached to the pad parts by a film attaching process. For example, the flexible film 210 may be a flexible film that may be bent, such as a tape carrier package or a chip on film. The flexible films 210 may be bent under the display panel 100 in order to decrease a bezel area of the display device.

The display drivers 220 may be mounted on the flexible films 210. For example, the display driver 220 may be implemented as an integrated circuit (IC). The display drivers 220 may receive digital video data and data control signals from the timing controller 240, may convert the digital video data into analog data voltages according to the data control signals, and may supply the analog data voltages to the data lines DL through the fan-out lines. The display drivers 220 may generate gate signals according to gate control signals supplied from the timing controller 240 and sequentially supply the gate signals to the plurality of vertical gate lines VGL according to a set order.

The circuit board 230 may support the timing controller 240 and the power supply unit 250, and may transfer signals and power between components of the display drivers 220. For example, the circuit board 230 may supply a signal supplied from the timing controller 240 and a source voltage supplied from the power supply unit 250 to the display drivers 220 in order to display an image in each pixel. To this end, signal transmission lines and a plurality of power lines may be provided on the circuit board 230.

The timing controller 240 may be mounted on the circuit board 230 and may receive image data and timing synchronization signals supplied from a display driving system or a graphic device through a user connector provided on the circuit board 230. The timing controller 240 may generate the digital video data by aligning the image data to be suitable for a pixel arrangement structure based on the timing synchronization signals, and may supply the generated digital video data to the display drivers 220. The timing controller 240 may generate the data control signals and the gate control signals based on the timing synchronization signals. The timing controller 240 may control a supply timing of data voltages of the display drivers 220 based on the data control signals, and may control a supply timing of the gate signals of the display drivers 220 based on the gate control signals.

The power supply unit 250 may be located on the circuit board 230, and may supply a source voltage to the display drivers 220 and the display panel 100. For example, the power supply unit 250 may generate a driving voltage or a high potential voltage and may supply the driving voltage or the high potential voltage to the first voltage lines VDL, may generate a low potential voltage and may supply the low potential voltage to the vertical voltage lines VVSL, and may generate an initialization voltage and may supply the initialization voltage to the initialization voltage lines VIL.

Figure 2:
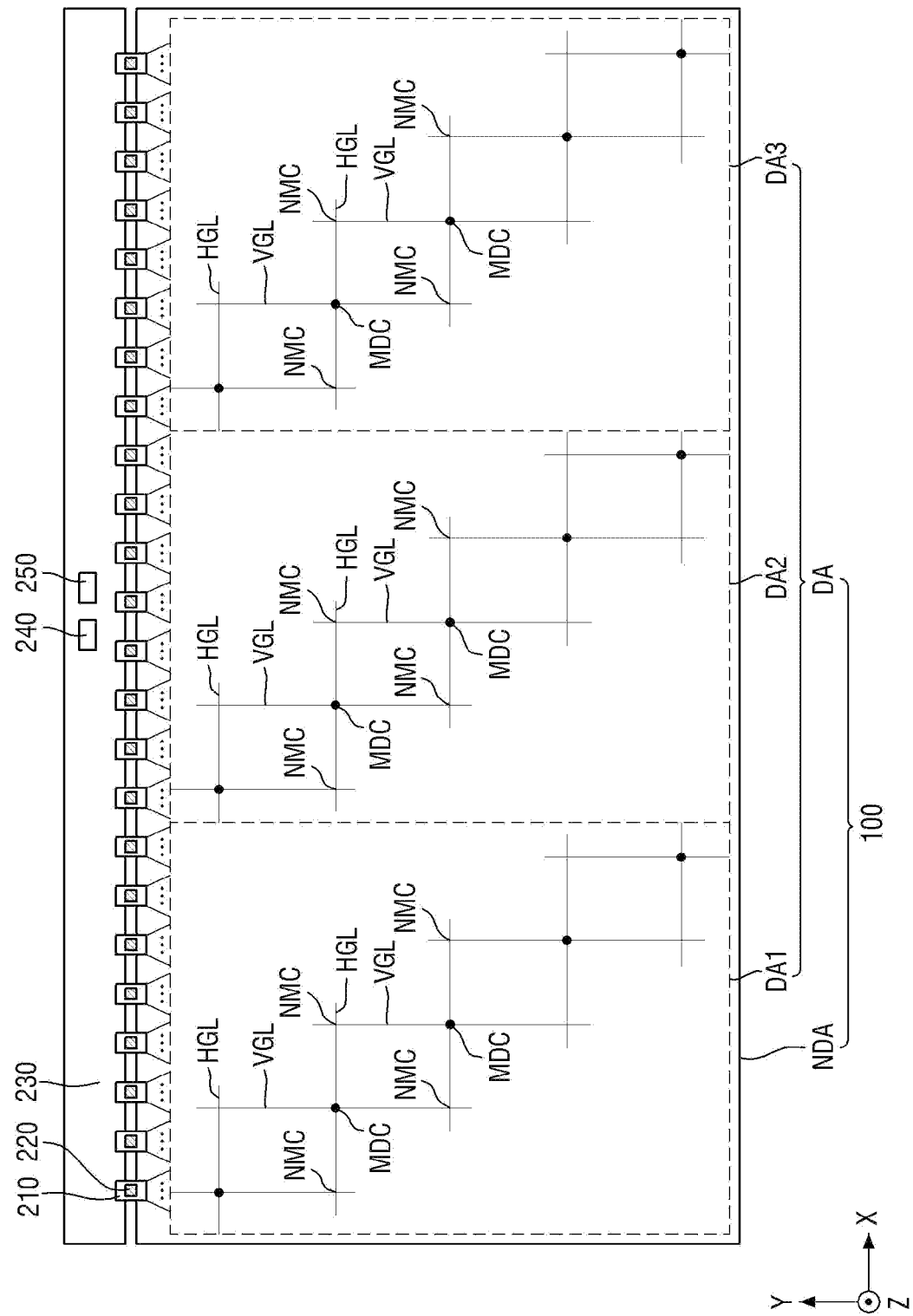
FIG. 2 is a plan view illustrating contact parts and non-contact parts of vertical gate lines and horizontal gate lines in the display device according to some embodiments.

FIG. 2 is a plan view illustrating contact parts and non-contact parts of vertical gate lines and horizontal gate lines in the display device according to some embodiments.

Referring to FIG. 2, the display area DA may include first to third display areas DA1, DA2, and DA3.

The plurality of horizontal gate lines HGL may cross the plurality of vertical gate lines VGL, respectively. For example, one horizontal gate line HGL may be connected to one vertical gate line VGL of the plurality of vertical gate lines VGL through a contact part MDC. One horizontal gate line HGL may be insulated from the other vertical gate lines VGL at non-contact parts NMC. The non-contact part NMC may correspond to a portion where the vertical gate line VGL and the horizontal gate line HGL are insulated from each other in a crossing area between the vertical gate line VGL and the horizontal gate line HGL.

The contact parts MDC of the first display area DA1 may be located on an extension line (e.g., an imaginary line) connecting the upper left side of the first display area DA1 to the lower right side of the first display area DA1. The contact parts MDC of the second display area DA2 may be located on an extension line (e.g., an imaginary line) connecting the upper left side of the second display area DA2 to the lower right side of the second display area DA2. The contact parts MDC of the third display area DA3 may be located on an extension line (e.g., an imaginary line) connecting the upper left side of the third display area DA3 to the lower right side of the third display area DA3. Accordingly, a plurality of contact parts MDC may be arranged along a diagonal direction between the first direction (X-axis direction) and the opposite direction to the second direction (Y-axis direction) in each of the first to third display areas DA1, DA2, and DA3.

The display device 10 may include the display drivers 220 serving as data drivers and gate drivers. Accordingly, the data lines DL receive the data voltages from the display drivers 220 located on the upper side of the display area DA, and the vertical gate lines GL receive the gate signals from the display drivers 220 located on the upper side of the display area DA, such that sizes of the left side, the right side, and the lower side of the non-display area NDA of the display device 10 may be reduced or minimized.

Figure 3:
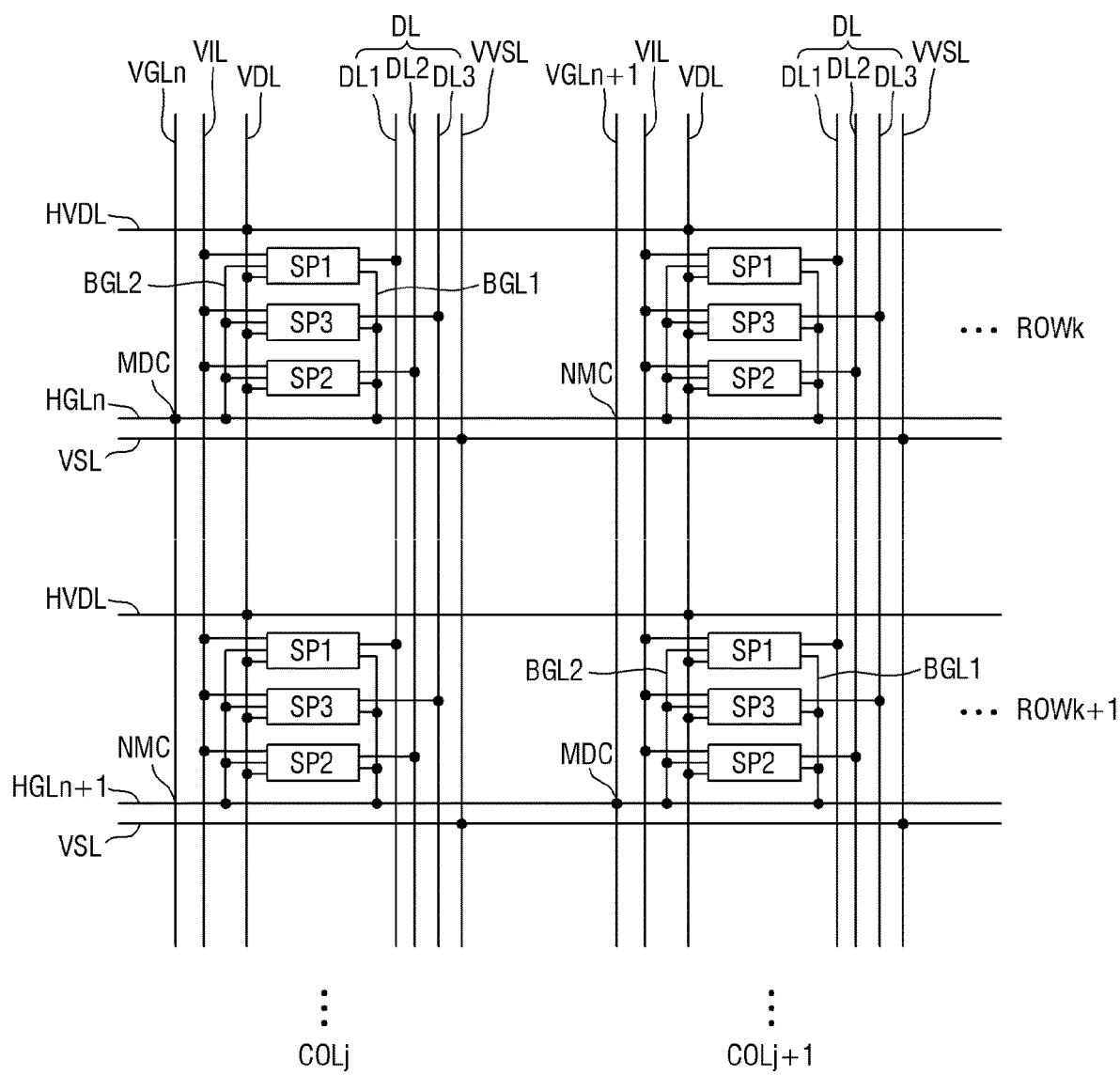
FIG. 3 is a diagram illustrating pixels and lines in the display device according to some embodiments.

FIG. 3 is a diagram illustrating pixels and lines in the display device according to some embodiments.

Referring to FIG. 3, the plurality of pixels SP may include first to third pixels SP1, SP2, and SP3. A pixel circuit of the first pixel SP1, a pixel circuit of the third pixel SP3, and a pixel circuit of the second pixel SP2 may be arranged in an opposite direction to the second direction (Y-axis direction), but the order of the pixel circuits is not limited thereto.

Each of the plurality of pixels SP may be connected to a first voltage line VDL, an initialization voltage line VIL, a gate line GL, and the data line DL.

The first voltage lines VDL may extend in the second direction (Y-axis direction). The first voltage line VDL may be located on one side (e.g., the left side) of the pixel circuits of the first to third pixels SP1, SP2, and SP3. The first voltage lines VDL may supply a driving voltage or a high potential voltage to the plurality of pixels SP. The first voltage lines VDL may supply a driving voltage to a transistor of each of the first to third pixels SP1, SP2, and SP3.

The horizontal voltage lines HVDL may extend in the first direction (X-axis direction). The horizontal voltage line HVDL may be located on the upper side of the pixel circuit of the first pixel SP1. The horizontal voltage lines HVDL may be connected to the first voltage lines VDL. The horizontal voltage lines HVDL may supply a driving voltage or a high potential voltage to the first voltage lines VDL.

The initialization voltage lines VIL may extend in the second direction (Y-axis direction). The initialization voltage line VIL may be located on one side (e.g., the left side) of a second auxiliary gate line BGL2. The initialization voltage lines VIL may supply an initialization voltage to the pixel circuit of each of the first to third pixels SP1, SP2, and SP3. The initialization voltage line VIL may receive the sensed signals from each of the pixel circuits of the first to third pixels SP1, SP2, and SP3 and may supply the sensed signals to the display drivers 220.

The gate line GL may include a vertical gate line VGL, a horizontal gate line HGL, and first and second auxiliary gate lines BGL1 and BGL2.

The plurality of vertical gate lines VGL may extend in the second direction (Y-axis direction). The vertical gate line VGL may be located on one side (e.g., the left side) of the initialization voltage line VIL. The vertical gate line VGL may be connected between the display driver 220 and the horizontal gate line HGL. The plurality of vertical gate lines VGL may cross the plurality of horizontal gate lines HGL, respectively. The vertical gate lines VGL may supply the gate signals received from the display drivers 220 to the horizontal gate lines HGL.

For example, an n-th vertical gate line VGLn (here, n is a positive integer) may be located on the left side of pixel circuits of first to third pixels SP1, SP2, and SP3 located in a j-th column COLj (here, j is a positive integer). The n-th vertical gate line VGLn may be connected to an n-th horizontal gate line HGLn through the contact part MDC, and may be insulated from an n+1-th horizontal gate line HGLn+1 through the non-contact part NMC. An n+1-th vertical gate line VGLn+1 may be located on the left side of pixel circuits of first to third pixels SP1, SP2, and SP3 located in a j+1-th column COLj+1. The n+1-th vertical gate line VGLn+1 may be insulated from the n-th horizontal gate line HGLn through the non-contact part NMC, and may be connected to the n+1-th horizontal gate line HGLn+1 through the contact part MDC.

The horizontal gate lines HGL may extend in the first direction (X-axis direction). The horizontal gate line HGL may be located on the lower side of the pixel circuit of the second pixel SP2. The horizontal gate line HGL may be connected between, or connected to, the vertical gate line VGL and the first and second auxiliary gate lines BGL1 and BGL2. The horizontal gate line HGL may supply the gate signal received from the vertical gate line VGL to the first and second auxiliary gate lines BGL1 and BGL2.

For example, the n-th horizontal gate line HGLn may be located on the lower side of a pixel circuit of a second pixel SP2 located in a k-th row ROWk (here, k is a positive integer). The n-th horizontal gate line HGLn may be connected to the n-th vertical gate line VGLn through the contact part MDC, and may be insulated from the n+1-th vertical gate line VGLn+1 through the non-contact part NMC. The n+1-th horizontal gate line HGLn+1 may be located on the lower side of a pixel circuit of a second pixel SP2 located in a k+1-th row ROWk+1. The n+1-th horizontal gate line HGLn+1 may be insulated from the n-th vertical gate line VGLn through the non-contact part NMC, and may be connected to the n+1-th vertical gate line VGLn+1 through the contact part MDC.

The first and second auxiliary gate lines BGL1 and BGL2 may extend from the horizontal gate lines HGL in the second direction (Y-axis direction). The first auxiliary gate line BGL1 may be located on the right side of the pixel circuits of the first to third pixels SP1, SP2, and SP3. The second auxiliary gate line BGL2 may be located between the initialization voltage line VIL and the first voltage line VDL. The first and second auxiliary gate lines BGL1 and BGL2 may supply the gate signal received from the horizontal gate line HGL to the pixel circuits of the first to third pixels SP1, SP2, and SP3.

The plurality of data lines DL may extend in the second direction (Y-axis direction). The plurality of data lines DL may supply the data voltages to the plurality of pixels SP. The plurality of data lines DL may include first to third data lines DL1, DL2, and DL3.

The first data lines DL1 may extend in the second direction (Y-axis direction). The first data line DL1 may be located on the other side (e.g., the right side) of the first auxiliary gate line BGL1. The first data line DL1 may supply the data voltage received from the display driver 220 to the pixel circuit of the first pixel SP1.

The second data lines DL2 may extend in the second direction (Y-axis direction). The second data line DL2 may be located on the other side (e.g., the right side) of the first data line DL1. The second data line DL2 may supply the data voltage received from the display driver 220 to the pixel circuit of the second pixel SP2.

The third data lines DL3 may extend in the second direction (Y-axis direction). The third data line DL3 may be located on the other side (e.g., the right side) of the second data line DL2. The third data line DL3 may supply the data voltage received from the display driver 220 to the pixel circuit of the third pixel SP3.

The vertical voltage lines VVSL may extend in the second direction (Y-axis direction). The vertical voltage line VVSL may be located on the other side (e.g., the right side) of the third data line DL3. The vertical voltage line VVSL may be connected between, or connected to, the power supply unit 250 and the second voltage line VSL. The vertical voltage line VVSL may supply a low potential voltage supplied from the power supply unit 250 to the second voltage line VSL.

The second voltage lines VSL may extend in the first direction (X-axis direction). The second voltage line VSL may be located on the lower side of the horizontal gate line HGL. The second voltage line VSL may supply the low potential voltage received from the vertical voltage line VVSL to a light emitting element layer of the first to third pixels SP1, SP2, and SP3.

Figure 4:
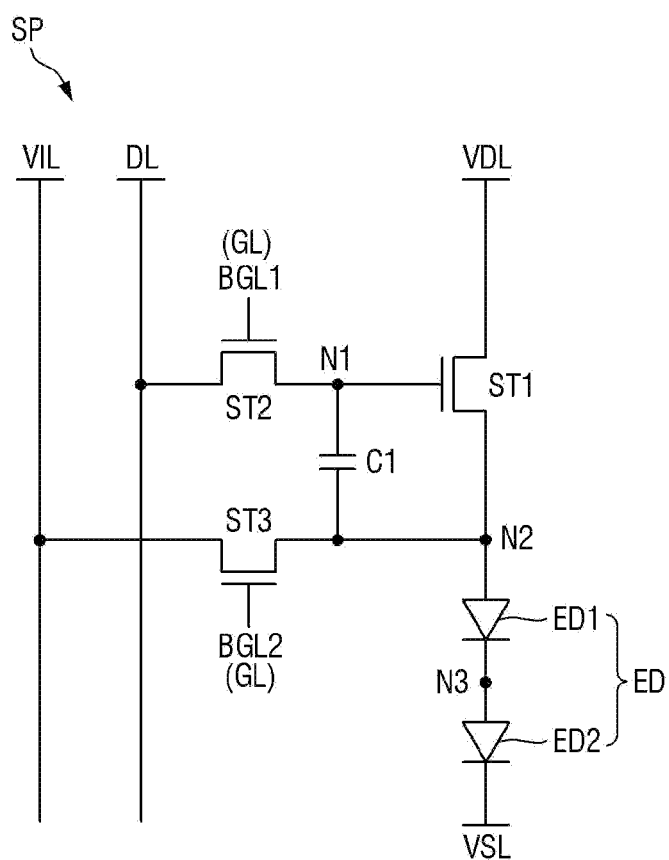
FIG. 4 is a circuit diagram illustrating a pixel of the display device according to some embodiments.

FIG. 4 is a circuit diagram illustrating a pixel of the display device according to some embodiments.

Referring to FIG. 4, each of the plurality of pixels SP may be connected to the first voltage line VDL, the data line DL, the initialization voltage line VIL, the first and second auxiliary gate lines BGL1 and BGL2, and the second voltage line VSL.

Each of the first to third pixels SP1, SP2, and SP3 may include first to third transistors ST1, ST2, and ST3, a first capacitor C1, and a plurality of light emitting elements ED.

The first transistor ST1 may include a gate electrode, a drain electrode, and a source electrode. The gate electrode of the first transistor ST1 may be connected to a first node N1, the drain electrode of the first transistor ST1 may be connected to the first voltage line VDL, and the source electrode of the first transistor ST1 may be connected to a second node N2. The first transistor ST1 may control a drain-source current (or a driving current) based on a data voltage applied to the gate electrode thereof.

The plurality of light emitting elements ED may include a first light emitting element ED1 and a second light emitting element ED2. The first and second light emitting elements ED1 and ED2 may be connected to each other in series. The first and second light emitting elements ED1 and ED2 may receive the driving current to emit light. A light emission amount or a luminance of the light emitting element ED may be proportional to a magnitude of the driving current. The light emitting element ED may be an inorganic light emitting element including an inorganic semiconductor, but is not limited thereto.

A first electrode of the first light emitting element ED1 may be connected to the second node N2, and a second electrode of the first light emitting element ED1 may be connected to a third node N3. The first electrode of the first light emitting element ED1 may be connected to the source electrode of the first transistor ST1, a source electrode of the third transistor ST3, and a second capacitor electrode of the first capacitor C1 through the second node N2. The second electrode of the first light emitting element ED1 may be connected to a first electrode of the second light emitting element ED2 through the third node N3.

The first electrode of the second light emitting element ED2 may be connected to the third node N3, and a second electrode of the second light emitting element ED2 may be connected to the second voltage line VSL. The first electrode of the second light emitting element ED2 may be connected to the second electrode of the first light emitting element ED1 through the third node N3.

The second transistor ST2 may be turned on by a gate signal of the first auxiliary gate line BGL1 or the gate line GL to connect the data line DL and the first node N1, which is the gate electrode of the first transistor ST1, to each other.

The second transistor ST2 may be turned on based on the gate signal to supply the data voltage to the first node N1. A gate electrode of the second transistor ST2 may be connected to the first auxiliary gate line BGL1, a drain electrode of the second transistor ST2 may be connected to the data line DL, and a source electrode of the second transistor ST2 may be connected to the first node N1. The source electrode of the second transistor ST2 may be connected to the gate electrode of the first transistor ST1 and a first capacitor electrode of the first capacitor C1 through the first node N1.

The third transistor ST3 may be turned on by a gate signal of the second auxiliary gate line BGL2 or the gate line GL to connect the initialization voltage line VIL and the second node N2, which is the source electrode of the first transistor ST1, to each other. The third transistor ST3 may be turned on based on the gate signal to supply the initialization voltage to the second node N2. A gate electrode of the third transistor ST3 may be connected to the second auxiliary gate line BGL2, a drain electrode of the third transistor ST3 may be connected to the initialization voltage line VIL, and the source electrode of the third transistor ST3 may be connected to the second node N2. The source electrode of the third transistor ST3 may be connected to the source electrode of the first transistor ST1, the second capacitor electrode of the first capacitor C1, and the first electrode of the first light emitting element ED1 through the second node N2.

Figure 5:
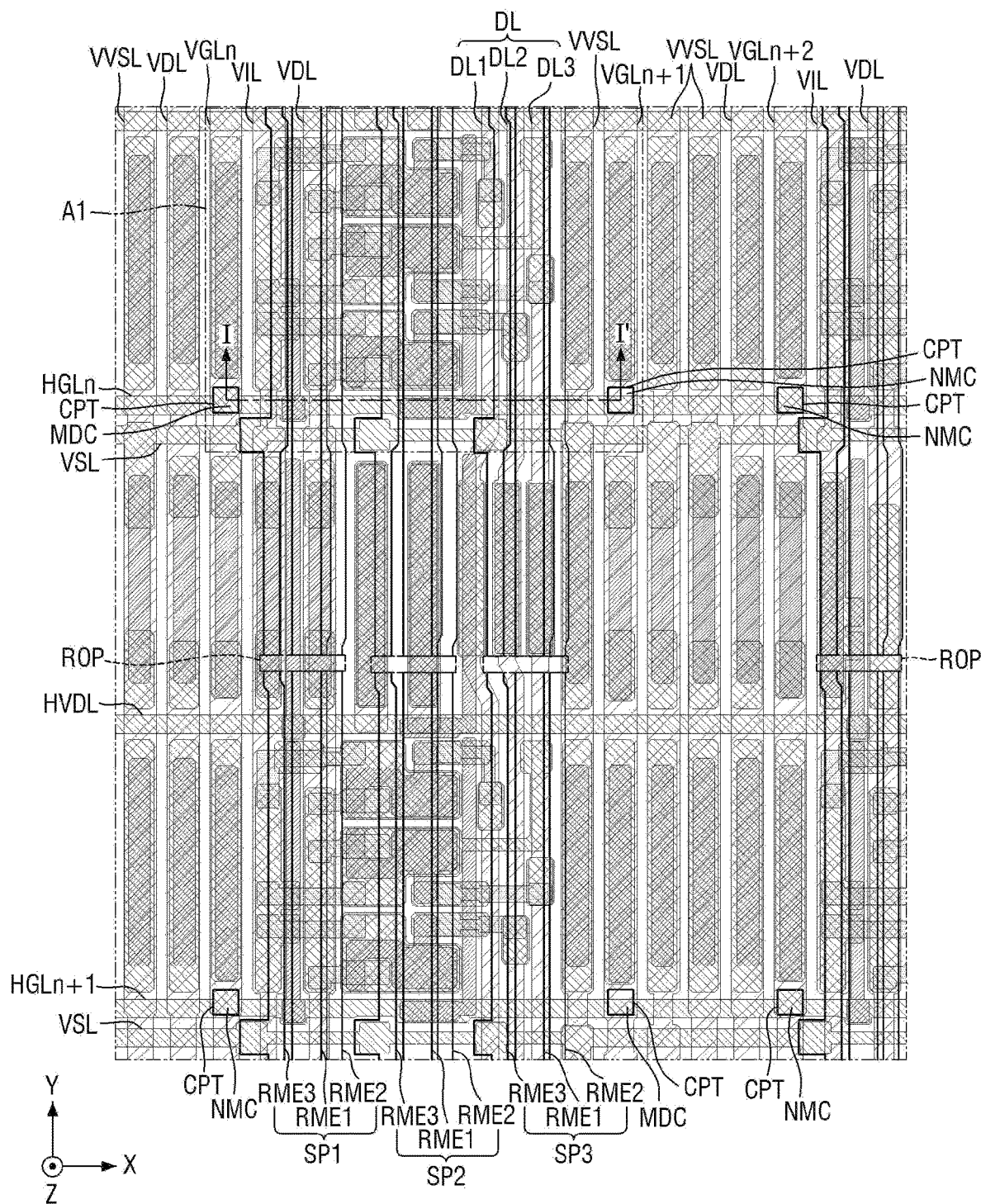
FIG. 5 is a plan view illustrating a portion of a display area in the display device according to some embodiments.
Figure 6:
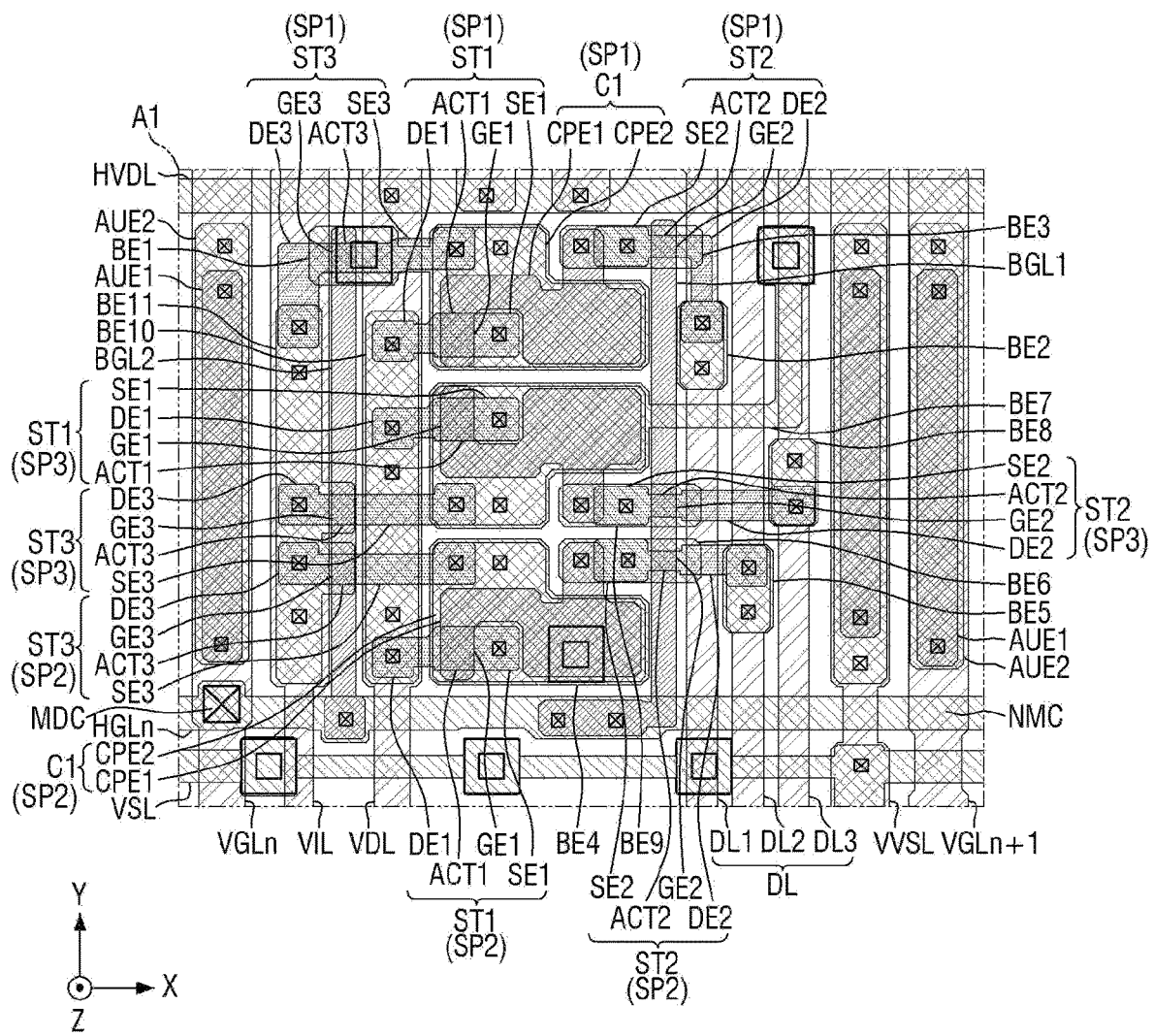
FIGS. 6 and 7 are enlarged views illustrating a thin film transistor layer in area A1 of FIG. 5.
Figure 7:
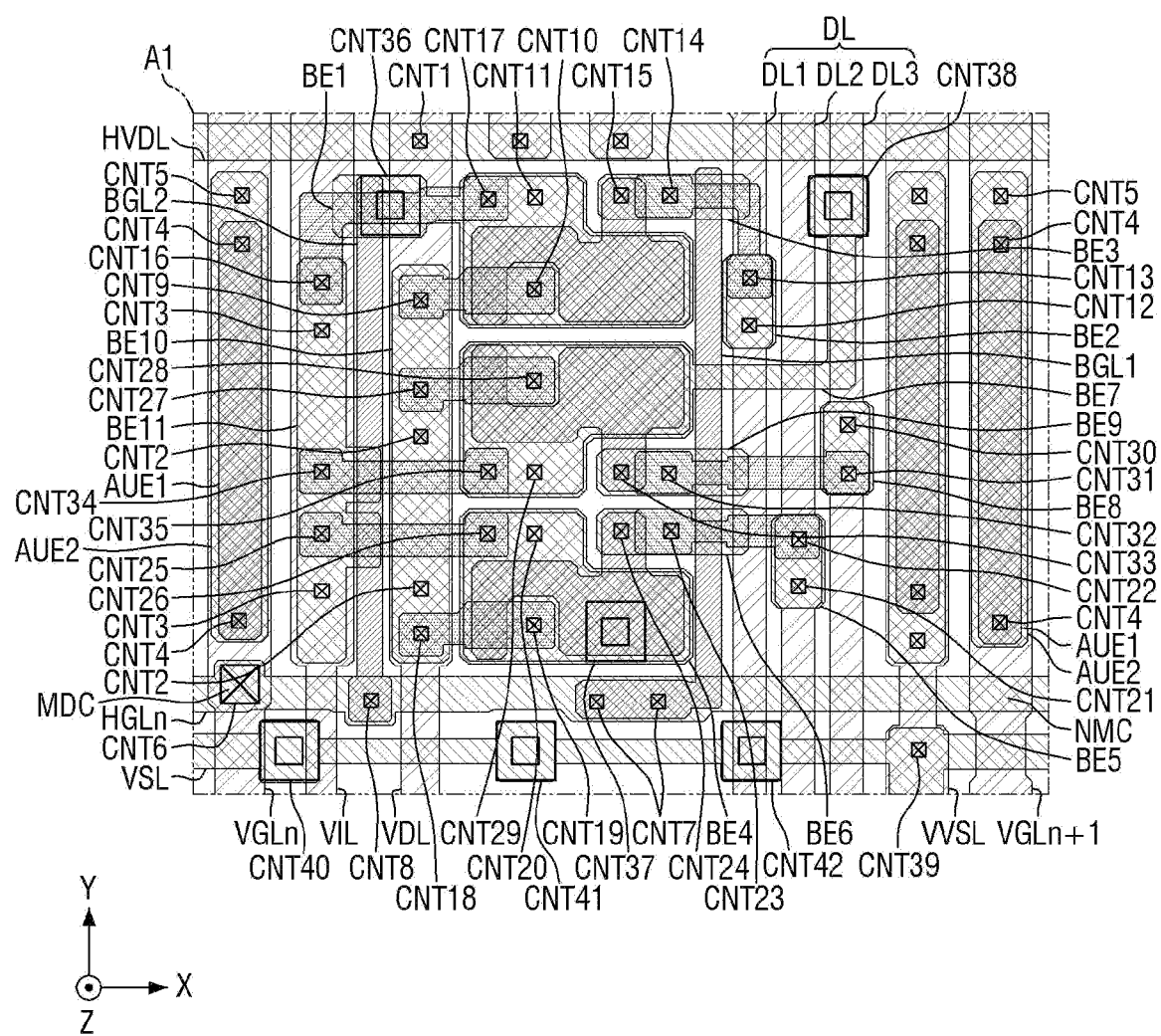
Figure 8:
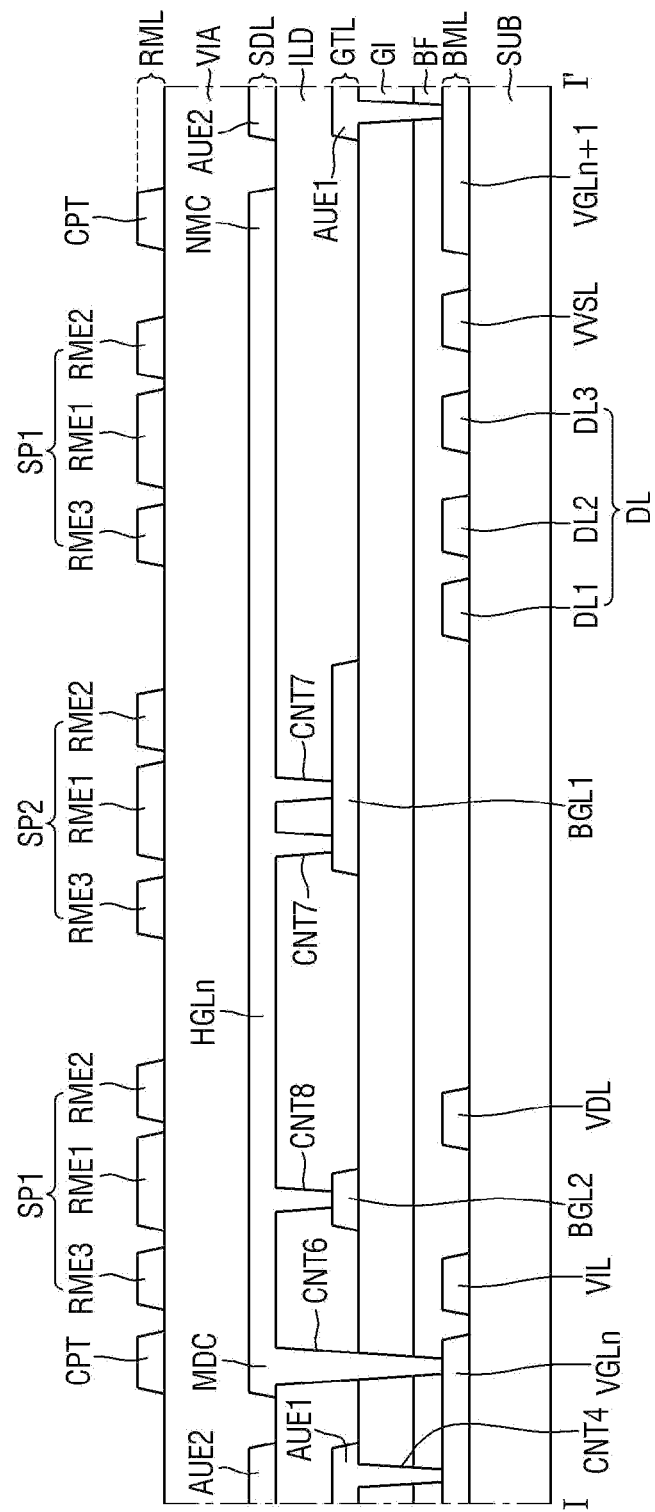
FIG. 8 is a cross-sectional view taken along the line I-I' of FIG. 5.

FIG. 5 is a plan view illustrating a portion of a display area in the display device according to some embodiments, FIGS. 6 and 7 are enlarged views illustrating a thin film transistor layer in area A1 of FIG. 5, and FIG. 8 is a cross-sectional view taken along the line I-I' of FIG. 5.

Referring to FIGS. 5 to 8, the display panel 100 may include first to third pixels SP1, SP2, and SP3. A pixel circuit of the first pixel SP1, a pixel circuit of the third pixel SP3, and a pixel circuit of the second pixel SP2 may be arranged in an opposite direction (e.g., downwardly) to the second direction (Y-axis direction). The pixel circuit of each of the first to third pixels SP1, SP2, and SP3 may be located in a pixel area.

The first voltage line VDL may be located in a first metal layer BML on a substrate SUB. The first voltage line VDL may be located on one side (e.g., the left side) of the pixel circuits of the first to third pixels SP1, SP2, and SP3. The first voltage line VDL may overlap a tenth connection electrode BE10 of a third metal layer SDL in a thickness direction (Z-axis direction). The first voltage line VDL may be connected to the tenth connection electrode BE10 through a plurality of second contact holes CNT2. The tenth connection electrode BE10 may be connected to a drain electrode DE1 of a first transistor ST1 of the first pixel SP1 through a ninth contact hole CNT9, may be connected to a drain electrode DE1 of a first transistor ST1 of the second pixel SP2 through an eighteenth contact hole CNT18, and may be connected to a drain electrode DE1 of a first transistor ST1 of the third pixel SP3 through a twenty-seventh contact hole CNT27. Accordingly, the first voltage line VDL may supply a driving voltage to the first to third pixels SP1, SP2, and SP3 through the tenth connection electrode BE10.

The horizontal voltage line HVDL may be located in the third metal layer SDL. The horizontal voltage line HVDL may be located on the upper side of the pixel circuit of the first pixel SP1. The horizontal voltage line HVDL may be connected to the plurality of first voltage lines VDL through a first contact hole CNT1. The horizontal voltage line HVDL may receive a driving voltage from the first voltage line VDL. The horizontal voltage line HVDL may be connected to the plurality of first voltage lines VDL to stably maintain a driving voltage or a high potential voltage of the plurality of first voltage lines VDL.

The initialization voltage line VIL may be located at the first metal layer BML. The initialization voltage line VIL may be located on one side (e.g., the left side) of a second auxiliary gate line BGL2. The initialization voltage line VIL may be connected to an eleventh connection electrode BE11 of the third metal layer SDL through a plurality of third contact holes CNT3. The eleventh connection electrode BE11 may be connected to a drain electrode DE3 of a third transistor ST3 of the first pixel SP1 through a sixteenth contact hole CNT16. The eleventh connection electrode BE11 may be connected to a drain electrode DE3 of a third transistor ST3 of the second pixel SP2 through a twenty-fifth contact hole CNT25. The eleventh connection electrode BE11 may be connected to a drain electrode DE3 of the third transistor ST3 of the third pixel SP3 through a thirty-fourth contact hole CNT34. Accordingly, the initialization voltage line VIL may supply an initialization voltage to the third transistors ST3 of each of the first to third pixels SP1, SP2, and SP3 and receive a sensed signal from the third transistors ST3.

The n-th vertical gate line VGLn may be located in the first metal layer BML. The n-th vertical gate line VGLn may be located on one side (e.g., the left side) of the initialization voltage line VIL. The n-th vertical gate line VGLn may overlap a first auxiliary electrode AUE1 of a second metal layer GTL in the thickness direction (Z-axis direction), and may be connected to the first auxiliary electrode AUE1 through a plurality of fourth contact holes CNT4. The n-th vertical gate line VGLn may overlap a second auxiliary electrode AUE2 of the third metal layer SDL in the thickness direction (Z-axis direction), and may be connected to the second auxiliary electrode AUE2 through a fifth contact hole CNT5. Accordingly, the n-th vertical gate line VGLn may be connected to the first and second auxiliary electrodes AUE1 and AUE2 to decrease line resistance.

The n-th horizontal gate line HGLn may be located in the third metal layer SDL. The n-th horizontal gate line HGLn may be located on the lower side of the pixel circuit of the second pixel SP2. The n-th horizontal gate line HGLn may be connected to the n-th vertical gate line VGLn through the contact part MDC. The contact part MDC may correspond to a portion where the n-th horizontal gate line HGLn is inserted (e.g., connected to a material within) a sixth contact hole CNT6 to come into contact (e.g., electrical contact) with the n-th vertical gate line VGLn. The n-th horizontal gate line HGLn may be connected to the first auxiliary gate line BGL1 through a plurality of seventh contact holes CNT7, and may be connected to the second auxiliary gate line BGL2 through an eighth contact hole CNT8. The n-th horizontal gate line HGLn may supply a gate signal received from the n-th vertical gate line VGLn to the first and second auxiliary gate lines BGL1 and BGL2.

The first and second auxiliary gate lines BGL1 and BGL2 may be located in the second metal layer GTL. The first auxiliary gate line BGL1 may be located on the other side (e.g., the right side) of the pixel circuits of the first to third pixels SP1, SP2, and SP3. The first auxiliary gate line BGL1 may supply a gate signal received from the n-th horizontal gate line HGLn to second transistors ST2 of the first to third pixels SP1, SP2, and SP3. The second auxiliary gate line BGL2 may be located between the initialization voltage line VIL and the first voltage line VDL. The second auxiliary gate line BGL2 may supply a gate signal received from the n-th horizontal gate line HGLn to the third transistors ST3 of the first to third pixels SP1, SP2, and SP3.

The first data line DL1 may be located in the first metal layer BML. The first data line DL1 may be located on the other side (e.g., the right side) of the first auxiliary gate line BGL1. The first data line DL1 may be connected to a second connection electrode BE2 of the third metal layer SDL through a twelfth contact hole CNT12, and the second connection electrode BE2 may be connected to a drain electrode DE2 of the second transistor ST2 of the first pixel SP1 through a thirteenth contact hole CNT13. The first data line DL1 may supply a data voltage to the second transistor ST2 of the first pixel SP1.

The second data line DL2 may be located in the first metal layer BML. The second data line DL2 may be located on the other side (e.g., the right side) of the first data line DL1. The second data line DL2 may be connected to a fifth connection electrode BE5 of the third metal layer SDL through a twenty-first contact hole CNT21, and the fifth connection electrode BE5 may be connected to a drain electrode DE2 of the second transistor ST2 of the second pixel SP2 through a twenty-second contact hole CNT22. The second data line DL2 may supply a data voltage to the second transistor ST2 of the second pixel SP2.

The third data line DL3 may be located in the first metal layer BML. The third data line DL3 may be located on the other side (e.g., the right side) of the second data line DL2. The third data line DL3 may be connected to an eighth connection electrode BE8 of the third metal layer SDL through a thirtieth contact hole CNT30, and the eighth connection electrode BE8 may be connected to a drain electrode DE2 of the second transistor ST2 of the third pixel SP3 through a thirty-first contact hole CNT31. The third data line DL3 may supply a data voltage to the second transistor ST2 of the third pixel SP3.

The vertical voltage line VVSL may be located in the first metal layer BML. The vertical voltage line VVSL may be located on the other side (e.g., the right side) of the third data line DL3. The vertical voltage line VVSL may be connected to the second voltage line VSL of the third metal layer SDL through a thirty-ninth contact hole CNT39. The vertical voltage line VVSL may supply a low potential voltage to the second voltage line VSL.

The second voltage line VSL may be located in the third metal layer SDL. The second voltage line VSL may be located on the lower side of the n-th horizontal gate line HGLn. The second voltage line VSL may supply the low potential voltage received from the vertical voltage line VVSL to third electrodes RME3 of each of the first to third pixels SP1, SP2, and SP3. For example, the second voltage line VSL may be connected to the third electrode RME3 of the first pixel SP1 through a fortieth contact hole CNT40. The second voltage line VSL may be connected to the third electrode RME3 of the second pixel SP2 through a forty-first contact hole CNT41. The second voltage line VSL may be connected to the third electrode RME3 of the third pixel SP3 through a forty-second contact hole CNT42. Here, the third electrodes RME3 of each of the first to third pixels SP1, SP2, and SP3 may be located in a fourth electrode layer RML, and the fortieth to forty-second contact holes CNT40, CNT41, and CNT42 may be formed to penetrate through a via layer VIA.

The n+1-th vertical gate line VGLn+1 may be located in the first metal layer BML. The n+1-th vertical gate line VGLn+1 may be located on the other side (e.g., the right side) of the vertical voltage line VVSL. The n+1-th vertical gate line VGLn+1 may be connected to a first auxiliary electrode AUE1 of the second metal layer GTL through a plurality of fourth contact holes CNT4. The n+1-th vertical gate line VGLn+1 may be connected to a second auxiliary electrode AUE2 of the third metal layer SDL through a fifth contact hole CNT5. Accordingly, the n+1-th vertical gate line VGLn+1 may be connected to the first and second auxiliary electrodes AUE1 and AUE2 to decrease line resistance.

The n-th horizontal gate line HGLn may be insulated from the n+1-th vertical gate line VGLn+1 through the non-contact part NMC. The non-contact part NMC may correspond to a portion where the n+1-th vertical gate line VGLn+1 of the first metal layer BML and the n-th horizontal gate line HGLn of the third metal layer SDL are insulated from each other by a buffer layer BF, a gate insulating film GI, and an interlayer insulating film ILD. Accordingly, the n-th horizontal gate line HGLn may be insulated from all vertical gate lines VGL except for the n-th vertical gate line VGLn.

The pixel circuit of the first pixel SP1 may include the first to third transistors ST1, ST2, and ST3. The first transistor ST1 of the first pixel SP1 may include an active region ACT1, a gate electrode GE1, the drain electrode DE1, and a source electrode SE1. The active region ACT1 of the first transistor ST1 may be located in an active layer, and may overlap the gate electrode GE1 of the first transistor ST1 in the thickness direction (Z-axis direction).

The gate electrode GE1 of the first transistor ST1 may be located in the second metal layer GTL. The gate electrode GE1 of the first transistor ST1 may be a portion of a first capacitor electrode CPE1 of a first capacitor C1. The first capacitor electrode CPE1 may be connected to a third connection electrode BE3 of the third metal layer SDL through a fifteenth contact hole CNT15, and the third connection electrode BE3 may be connected to a source electrode SE2 of the second transistor ST2 through a fourteenth contact hole CNT14.

The drain electrode DE1 and the source electrode SE1 of the first transistor ST1 may be provided by heat-treating the active layer to make the active layer conductors. The drain electrode DE1 of the first transistor ST1 may be connected to the tenth connection electrode BE10 of the third metal layer SDL through the ninth contact hole CNT9, and the tenth connection electrode BE10 may be connected to the first voltage line VDL through the plurality of second contact holes CNT2. The drain electrode DE1 of the first transistor ST1 may receive the driving voltage from the first voltage line VDL.

The source electrode SE1 of the first transistor ST1 may be connected to a first connection electrode BE1 of the third metal layer SDL through a tenth contact hole CNT10. The first connection electrode BE1 may be connected to a second capacitor electrode CPE2 of the first metal layer BML through an eleventh contact hole CNT11. Accordingly, the first capacitor C1 may be doubly formed between the first capacitor electrode CPE1 and the second capacitor electrode CPE2, and between the first capacitor electrode CPE1 and the first connection electrode BE1.

The first connection electrode BE1 may be connected to a source electrode SE3 of the third transistor ST3 through a seventeenth contact hole CNT17. The first connection electrode BE1 may be connected to a first electrode RME1 of the first pixel SP1 through a thirty-sixth contact hole CNT36. Here, the first electrode RME1 of the first pixel SP1 may be located in the fourth electrode layer RML, and the thirty-sixth contact hole CNT36 may be formed to penetrate through the via layer VIA.

The second transistor ST2 of the first pixel SP1 may include an active region ACT2, a gate electrode GE2, the drain electrode DE2, and the source electrode SE2. The active region ACT2 of the second transistor ST2 may be located in the active layer, and may overlap the gate electrode GE2 of the second transistor ST2 in the thickness direction (Z-axis direction).

The gate electrode GE2 of the second transistor ST2 may be located in the second metal layer GTL. The gate electrode GE2 of the second transistor ST2 may be a portion of the first auxiliary gate line BGL1.

The drain electrode DE2 of the second transistor ST2 may be connected to the second connection electrode BE2 through the thirteenth contact hole CNT13, and the second connection electrode BE2 may be directly connected to the first data line DL1 through the twelfth contact hole CNT12. The drain electrode DE2 of the second transistor ST2 may receive the data voltage of the first pixel SP1 from the first data line DL1.

The source electrode SE2 of the second transistor ST2 may be connected to the third connection electrode BE3 through the fourteenth contact hole CNT14. The third connection electrode BE3 may be connected to the first capacitor electrode CPE1 through the fifteenth contact hole CNT15 to be connected to the gate electrode GE1 of the first transistor ST1.

The third transistor ST3 of the first pixel SP1 may include an active region ACT3, a gate electrode GE3, the drain electrode DE3, and the source electrode SE3. The active region ACT3 of the third transistor ST3 may be located in the active layer, and may overlap the gate electrode GE3 of the third transistor ST3 in the thickness direction (Z-axis direction).

The gate electrode GE3 of the third transistor ST3 may be located in the second metal layer GTL. The gate electrode GE3 of the third transistor ST3 may be a portion of the second auxiliary gate line BGL2.

The drain electrode DE3 of the third transistor ST3 may be connected to the eleventh connection electrode BE11 through the sixteenth contact hole CNT16, and the eleventh connection electrode BE11 may be directly connected to the initialization voltage line VIL through the plurality of third contact holes CNT3. The drain electrode DE3 of the third transistor ST3 may receive the initialization voltage from the initialization voltage line VIL. The drain electrode DE3 of the third transistor ST3 may supply the sensed signal to the initialization voltage line VIL.

The source electrode SE3 of the third transistor ST3 may be connected to the first connection electrode BE1 through the seventeenth contact hole CNT17. The first connection electrode BE1 may be connected to the source electrode SE1 of the first transistor ST1 through the tenth contact hole CNT10, may be connected to the second capacitor electrode CPE2 of the first metal layer BML through the eleventh contact hole CNT11, and may be connected to the first electrode RME1 of the first pixel SP1 through the thirty-sixth contact hole CNT36.

The pixel circuit of the second pixel SP2 may include the first to third transistors ST1, ST2, and ST3. The first transistor ST1 of the second pixel SP2 may include an active region ACT1, a gate electrode GE1, the drain electrode DE1, and a source electrode SE1. The active region ACT1 of the first transistor ST1 may be located in the active layer, and may overlap the gate electrode GE1 of the first transistor ST1 in the thickness direction (Z-axis direction).

The gate electrode GE1 of the first transistor ST1 may be located in the second metal layer GTL. The gate electrode GE1 of the first transistor ST1 may be a portion of a first capacitor electrode CPE1 of a first capacitor C1. The first capacitor electrode CPE1 may be connected to a sixth connection electrode BE6 of the third metal layer SDL through a twenty-fourth contact hole CNT24, and the sixth connection electrode BE6 may be connected to a source electrode SE2 of the second transistor ST2 through a twenty-third contact hole CNT23.

The drain electrode DE1 and the source electrode SE1 of the first transistor ST1 may be provided by heat-treating the active layer to make the active layer conductors. The drain electrode DE1 of the first transistor ST1 may be connected to the tenth connection electrode BE10 through the eighteenth contact hole CNT18. The tenth connection electrode BE10 may be connected to the first voltage line VDL through the plurality of second contact holes CNT2. The drain electrode DE1 of the first transistor ST1 may receive the driving voltage from the first voltage line VDL.

The source electrode SE1 of the first transistor ST1 may be connected to a fourth connection electrode BE4 of the third metal layer SDL through a nineteenth contact hole CNT19. The fourth connection electrode BE4 may be connected to a second capacitor electrode CPE2 of the first metal layer BML through a twentieth contact hole CNT20. Accordingly, the first capacitor C1 may be doubly formed between the first capacitor electrode CPE1 and the second capacitor electrode CPE2, and between the first capacitor electrode CPE1 and the fourth connection electrode BE4.

The fourth connection electrode BE4 may be connected to a source electrode SE3 of the third transistor ST3 through a twenty-sixth contact hole CNT26. The fourth connection electrode BE4 may be connected to a first electrode RME1 of the second pixel SP2 through a thirty-seventh contact hole CNT37. Here, the first electrode RME1 of the second pixel SP2 may be located in the fourth electrode layer RML, and the thirty-seventh contact hole CNT37 may be formed to penetrate through the via layer VIA.

The second transistor ST2 of the second pixel SP2 may include an active region ACT2, a gate electrode GE2, the drain electrode DE2, and the source electrode SE2. The active region ACT2 of the second transistor ST2 may be located in the active layer, and may overlap the gate electrode GE2 of the second transistor ST2 in the thickness direction (Z-axis direction).

The gate electrode GE2 of the second transistor ST2 may be located in the second metal layer GTL. The gate electrode GE2 of the second transistor ST2 may be a portion of the first auxiliary gate line BGL1.

The drain electrode DE2 of the second transistor ST2 may be connected to the fifth connection electrode BE5 through the twenty-second contact hole CNT22, and the fifth connection electrode BE5 may be directly connected to the second data line DL2 through the twenty-first contact hole CNT21. The drain electrode DE2 of the second transistor ST2 may receive the data voltage of the second pixel SP2 from the second data line DL2.

The source electrode SE2 of the second transistor ST2 may be connected to the sixth connection electrode BE6 through the twenty-third contact hole CNT23. The sixth connection electrode BE6 may be connected to the first capacitor electrode CPE1 through the twenty-fourth contact hole CNT24 to be connected to the gate electrode GE1 of the first transistor ST1.

The third transistor ST3 of the second pixel SP2 may include an active region ACT3, a gate electrode GE3, the drain electrode DE3, and the source electrode SE3. The active region ACT3 of the third transistor ST3 may be located in the active layer, and may overlap the gate electrode GE3 of the third transistor ST3 in the thickness direction (Z-axis direction).

The gate electrode GE3 of the third transistor ST3 may be located in the second metal layer GTL. The gate electrode GE3 of the third transistor ST3 may be a portion of the second auxiliary gate line BGL2.

The drain electrode DE3 of the third transistor ST3 may be connected to the eleventh connection electrode BE11 through the twenty-fifth contact hole CNT25, and the eleventh connection electrode BE11 may be directly connected to the initialization voltage line VIL through the plurality of third contact holes CNT3. The drain electrode DE3 of the third transistor ST3 may receive the initialization voltage from the initialization voltage line VIL. The drain electrode DE3 of the third transistor ST3 may supply the sensed signal to the initialization voltage line VIL.

The source electrode SE3 of the third transistor ST3 may be connected to the fourth connection electrode BE4 through the twenty-sixth contact hole CNT26. The fourth connection electrode BE4 may be connected to the source electrode SE1 of the first transistor ST1 through the nineteenth contact hole CNT19, may be connected to the second capacitor electrode CPE2 of the first metal layer BML through the twentieth contact hole CNT20, and may be connected to the first electrode RME1 of the second pixel SP2 through the thirty-seventh contact hole CNT37.

The pixel circuit of the third pixel SP3 may include the first to third transistors ST1, ST2, and ST3. The first transistor ST1 of the third pixel SP3 may include an active region ACT1, a gate electrode GE1, the drain electrode DE1, and a source electrode SE1. The active region ACT1 of the first transistor ST1 may be located in the active layer, and may overlap the gate electrode GE1 of the first transistor ST1 in the thickness direction (Z-axis direction).

The gate electrode GE1 of the first transistor ST1 may be located in the second metal layer GTL. The gate electrode GE1 of the first transistor ST1 may be a portion of a first capacitor electrode CPE1 of a first capacitor C1. The first capacitor electrode CPE1 may be connected to a ninth connection electrode BE9 of the third metal layer SDL through a thirty-third contact hole CNT33, and the ninth connection electrode BE9 may be connected to a source electrode SE2 of the second transistor ST2 through a thirty-second contact hole CNT32.

The drain electrode DE1 and the source electrode SE1 of the first transistor ST1 may be provided by heat-treating the active layer to make the active layer conductors. The drain electrode DE1 of the first transistor ST1 may be connected to the tenth connection electrode BE10 through the twenty-seventh contact hole CNT27. The tenth connection electrode BE10 may be connected to the first voltage line VDL through the plurality of second contact holes CNT2. The drain electrode DE1 of the first transistor ST1 may receive the driving voltage from the first voltage line VDL.

The source electrode SE1 of the first transistor ST1 may be connected to a seventh connection electrode BE7 of the third metal layer SDL through a twenty-eighth contact hole CNT28. The seventh connection electrode BE7 may be connected to a second capacitor electrode CPE2 of the first metal layer BML through a twenty-ninth contact hole CNT29. Accordingly, the first capacitor C1 may be doubly formed between the first capacitor electrode CPE1 and the second capacitor electrode CPE2, and between the first capacitor electrode CPE1 and the seventh connection electrode BE7.

The seventh connection electrode BE7 may be connected to a source electrode SE3 of the third transistor ST3 through a thirty-fifth contact hole CNT35. The seventh connection electrode BE7 may be connected to a first electrode RME1 of the third pixel SP3 through a thirty-eighth contact hole CNT38. Here, the first electrode RME1 of the third pixel SP3 may be located in the fourth electrode layer RML, and the thirty-eighth contact hole CNT38 may be formed to penetrate through the via layer VIA.

The second transistor ST2 of the third pixel SP2 may include an active region ACT2, a gate electrode GE2, the drain electrode DE2, and the source electrode SE2. The active region ACT2 of the second transistor ST2 may be located in the active layer, and may overlap the gate electrode GE2 of the second transistor ST2 in the thickness direction (Z-axis direction).

The gate electrode GE2 of the second transistor ST2 may be located in the second metal layer GTL. The gate electrode GE2 of the second transistor ST2 may be a portion of the first auxiliary gate line BGL1.

The drain electrode DE2 of the second transistor ST2 may be connected to the eighth connection electrode BE8 through the thirty-first contact hole CN31, and the eighth connection electrode BE8 may be directly connected to the third data line DL3 through the thirtieth contact hole CNT30. The drain electrode DE2 of the second transistor ST2 may receive the data voltage of the third pixel SP3 from the third data line DL3.

The source electrode SE2 of the second transistor ST2 may be connected to the ninth connection electrode BE9 through the thirty-second contact hole CNT32. The ninth connection electrode BE9 may be connected to the first capacitor electrode CPE1 through the thirty-third contact hole CNT33 to be connected to the gate electrode GE1 of the first transistor ST1.

The third transistor ST3 of the third pixel SP3 may include an active region ACT3, a gate electrode GE3, the drain electrode DE3, and the source electrode SE3. The active region ACT3 of the third transistor ST3 may be located in the active layer, and may overlap the gate electrode GE3 of the third transistor ST3 in the thickness direction (Z-axis direction).

The gate electrode GE3 of the third transistor ST3 may be located in the second metal layer GTL. The gate electrode GE3 of the third transistor ST3 may be a portion of the second auxiliary gate line BGL2.

The drain electrode DE3 of the third transistor ST3 may be connected to the eleventh connection electrode BE11 through the thirty-fourth contact hole CNT34, and the eleventh connection electrode BE11 may be directly connected to the initialization voltage line VIL through the plurality of third contact holes CNT3. The drain electrode DE3 of the third transistor ST3 may receive the initialization voltage from the initialization voltage line VIL. The drain electrode DE3 of the third transistor ST3 may supply the sensed signal to the initialization voltage line VIL.

The source electrode SE3 of the third transistor ST3 may be connected to the seventh connection electrode BE7 through the thirty-fifth contact hole CNT35. The seventh connection electrode BE7 may be connected to the source electrode SE1 of the first transistor ST1 through the twenty-eighth contact hole CNT28, may be connected to the second capacitor electrode CPE2 of the first metal layer BML through the twenty-ninth contact hole CNT29, and may be connected to the first electrode RME1 of the third pixel SP3 through the thirty-eighth contact hole CNT38.

A light emitting element layer of the display panel 100 may include the fourth electrode layer RML. The first to third electrodes RME1, RME2, and RME3 of each of the first to third pixels SP1, SP2, and SP3 may be located in the fourth electrode layer RML. The first to third electrodes RME1, RME2, and RME3 of the first pixel SP1 may be located on the left side of the pixel area, the first to third electrodes RME1, RME2, and RME3 of the second pixel SP2 may be located at the center of the pixel area, and the first to third electrodes RME1, RME2, and RME3 of the third pixel SP3 may be located on the right side of the pixel area. The first electrode RME1 of each of the first to third pixels SP1, SP2, and SP3 may be located between the respective second and third electrodes RME2 and RME3, and the second electrode RME2 of each of the first to third pixels SP1, SP2, and SP3 may be located on the right side of the respective first electrode RME1, and the third electrode RME3 of each of the first to third pixels SP1, SP2, and SP3 may be located on the left side of the respective first electrode RME1.

The first to third electrodes RME1, RME2, and RME3 may extend in the second direction (Y-axis direction). The first to third electrodes RME1, RME2, and RME3 may be separated in units of rows by separation parts ROP. The first to third electrodes RME1, RME2, and RME3 may be alignment electrodes for aligning the first and second light emitting elements ED1 and ED2 in processes of manufacturing the display device 10. Accordingly, the first to third electrodes RME1, RME2, and RME3 may be separated by the separation parts ROP after a process of aligning the plurality of light emitting elements ED is completed.

Cover patterns CPT may be located in the fourth electrode layer RML. The cover patterns CPT may be located on crossing points between the plurality of vertical gate lines VGL and the plurality of horizontal gate lines HGL. The cover patterns CPT may be located on a plurality of contact parts MDC and a plurality of non-contact parts NMC. For example, the cover pattern CPT located on an crossing point between the n-th vertical gate line VGLn and the n-th horizontal gate line HGLn may be located on the left side of the third electrode RME3 of the first pixel SP1. The cover pattern CPT located on an crossing point between the n+1-th vertical gate line VGLn+1 and the n-th horizontal gate line HGLn may be located on the right side of the second electrode RME2 of the third pixel SP3. The cover patterns CPT may be floated, but are not limited thereto. The cover patterns CPT may reflect at least a portion of incident light. When the cover patterns CPT do not exist, the contact part MDC and the non-contact part NMC may be recognized to be different from each other in an optical inspection. In FIG. 2, the plurality of contact parts MDC may be arranged along the diagonal direction between the first direction (X-axis direction) and the opposite direction to the second direction (Y-axis direction) in each of the first to third display areas DA1, DA2, and DA3, and unit pixel areas may have different shapes depending on positions of the contact parts MDC. The unit pixel area may include several pixel areas, but is not limited thereto. Accordingly, the cover patterns CPT are located on the plurality of contact parts MDC and the plurality of non-contact parts NMC, such that a plurality of unit pixel areas may be recognized to be the same as each other in the optical inspection. The display device may secure reliability by normally determining the possibility of a defect in an optical inspection process of the plurality of unit pixel areas.

Figure 9:
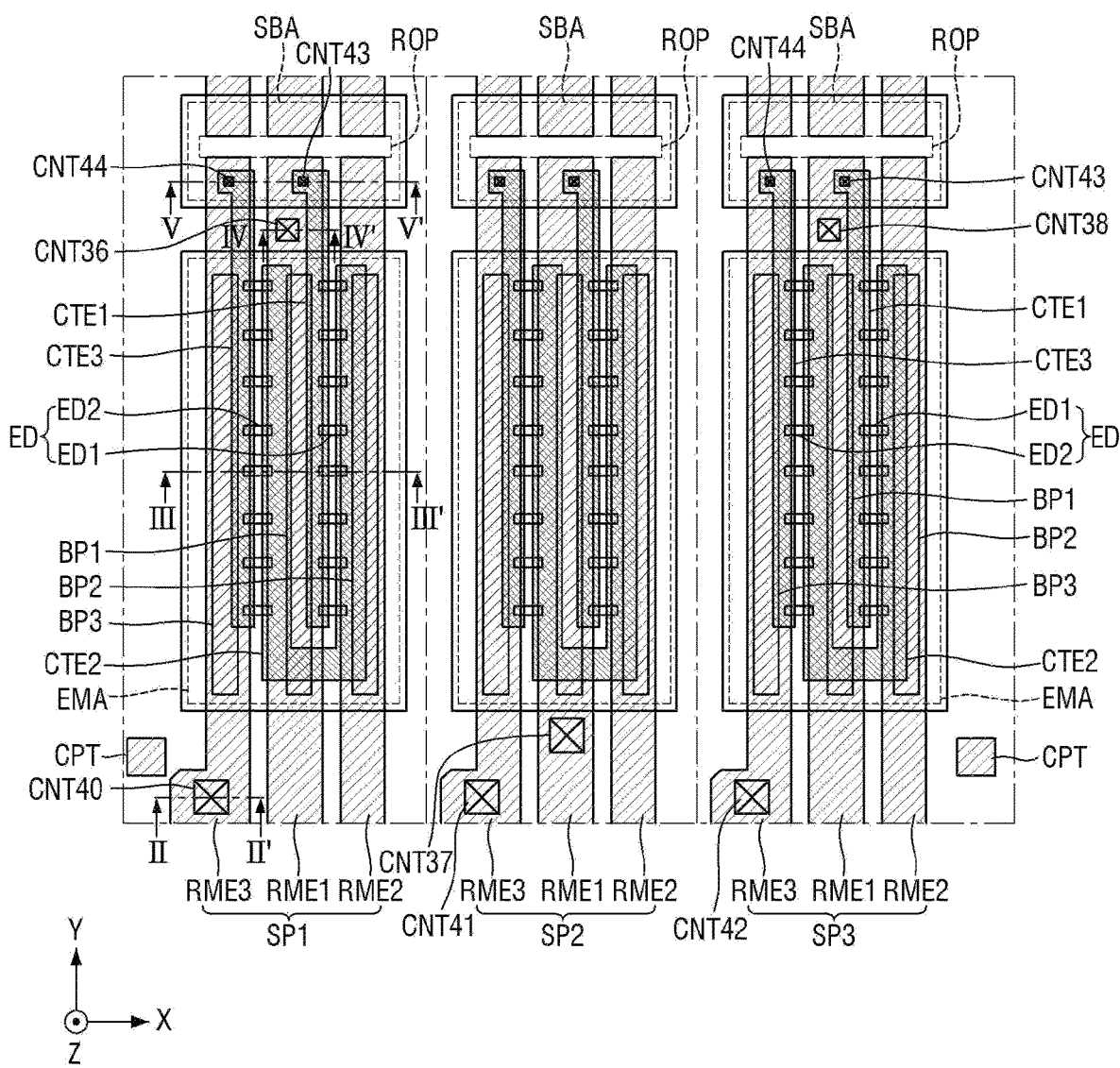
FIG. 9 is a plan view illustrating a light emitting element layer of the display device according to some embodiments.
Figure 10:
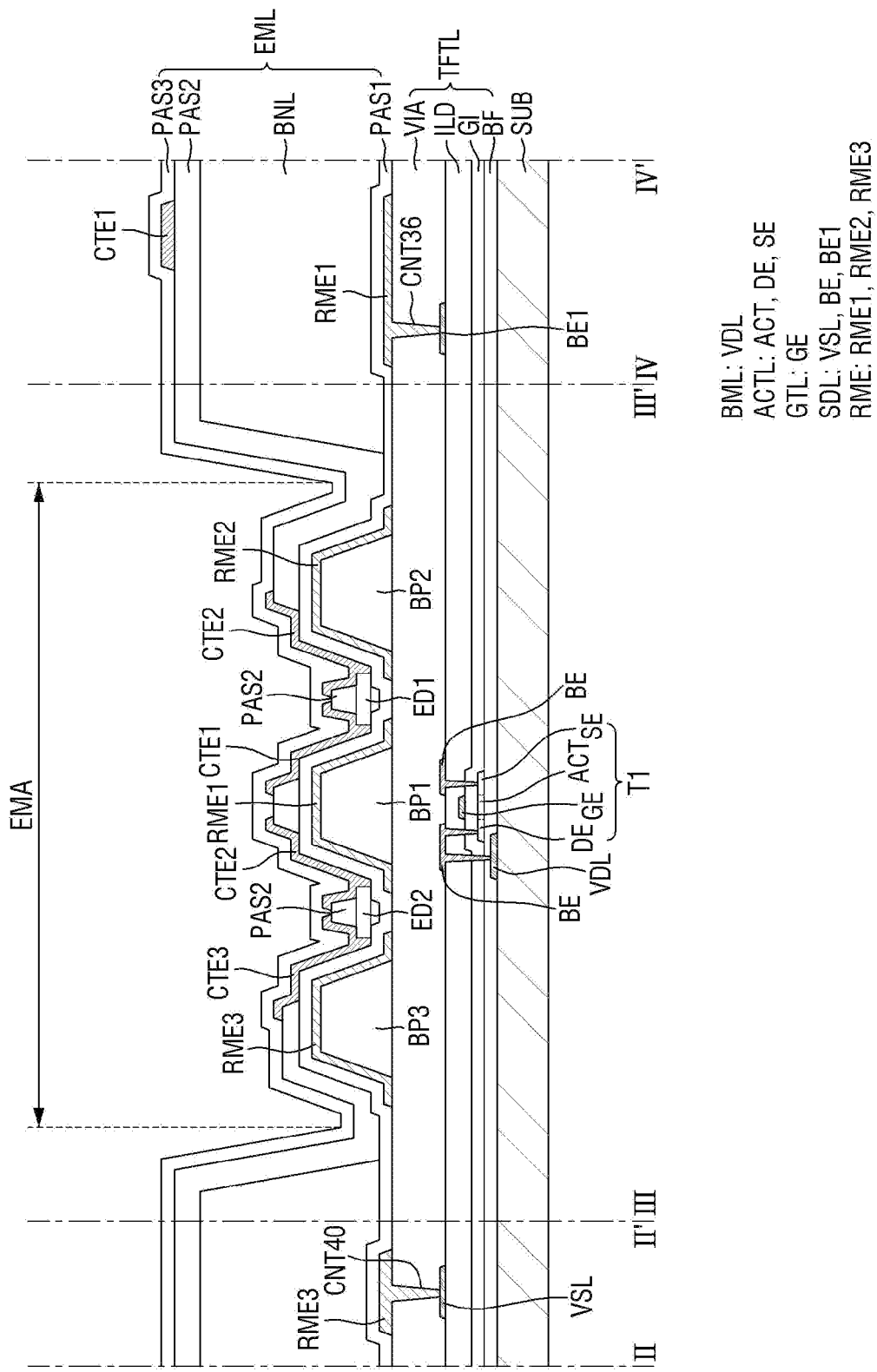
FIG. 10 is a cross-sectional view taken along the lines II-II', III-III', and IV-IV' of FIG. 9.
Figure 11:
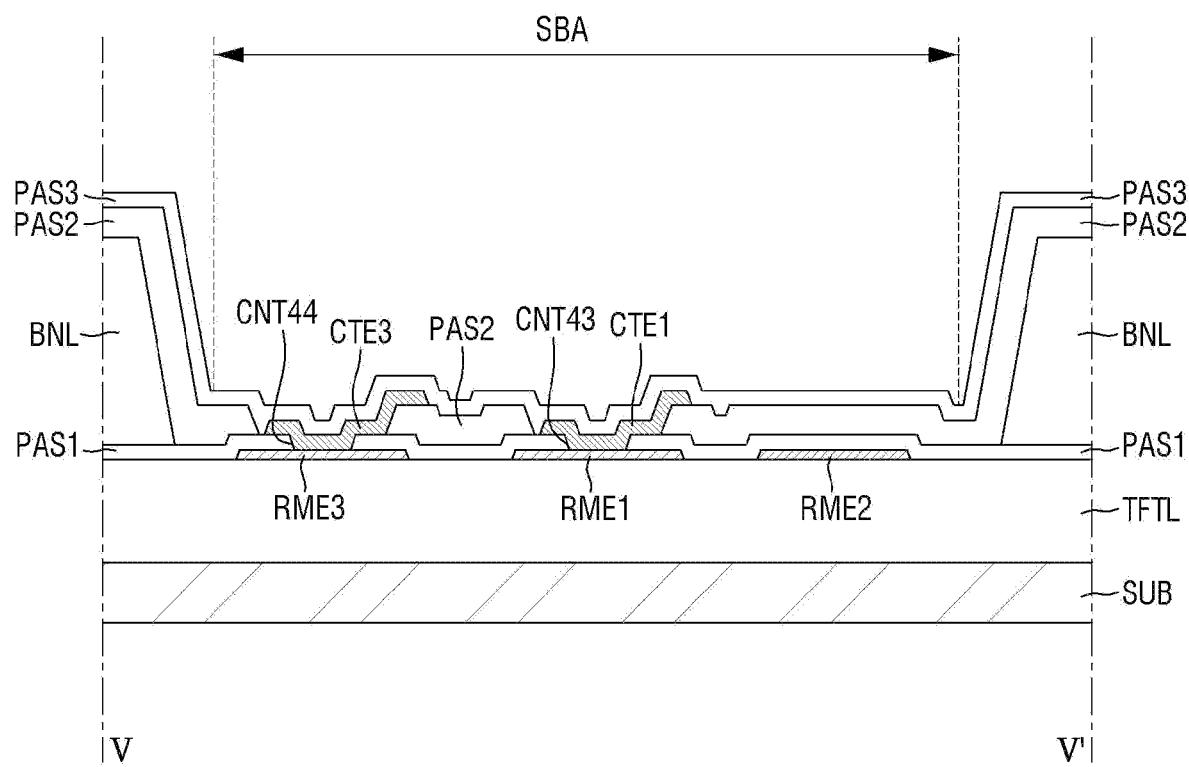
FIG. 11 is a cross-sectional view taken along the line V-V' of FIG. 9.

FIG. 9 is a plan view illustrating a light emitting element layer of the display device according to some embodiments, FIG. 10 is a cross-sectional view taken along the lines II-II', III-III', and IV-IV' of FIG. 9, and FIG. 11 is a cross-sectional view taken along the line V-V' of FIG. 9.

Referring to FIGS. 9 to 11, a light emitting element layer EML of the display device 10 may be located on a thin film transistor layer TFTL. The light emitting element layer EML may include first to third bank patterns BP1, BP2, and BP3, first to third electrodes RME1, RME2, and RME3, cover patterns CPT, first and second light emitting elements ED1 and ED2, a first insulating film PAS1, a bank layer BNL, a second insulating film PAS2, first to third contact electrodes CTE1, CTE2, and CTE3, and a third insulating film PAS3.

The first bank pattern BP1 may be located at the center of an emission area EMA, the second bank pattern BP2 may be located at the right side of the emission area EMA, and the third bank pattern BP3 may be located at the left side of the emission area EMA. Each of the first to third bank patterns BP1, BP2, and BP3 may protrude in an upward direction (Z-axis direction) on the via layer VIA. Each of the first to third bank patterns BP1, BP2, and BP3 may have inclined side surfaces. A plurality of first light emitting elements ED1 may be located between the first and second bank patterns BP1 and BP2 spaced apart from each other, and a plurality of second light emitting elements ED2 may be located between the second and third bank patterns BP2 and BP3 spaced apart from each other. The first to third bank patterns BP1, BP2, and BP3 may have the same length in the second direction (Y-axis direction), and may have different lengths in the first direction (X-axis direction), but are not limited thereto. The first to third bank patterns BP1, BP2, and BP3 may be located as island-shaped patterns on the entire surface of the display area DA.

The first to third electrodes RME1, RME2, and RME3 of each of the first to third pixels SP1, SP2, and SP3 may be located in the fourth electrode layer RML. The first electrode RME1 may extend in the second direction (Y-axis direction) at the center of the emission area EMA. The first electrode RME1 may cover an upper surface and the inclined side surfaces of the first bank pattern BP1. Accordingly, the first electrode RME1 may reflect light emitted from the first and second light emitting elements ED1 and ED2 in the upward direction (Z-axis direction).

The second electrode RME2 may extend in the second direction (Y-axis direction) at the right side of the emission area EMA. The second electrode RME2 may cover an upper surface and the inclined side surfaces of the second bank pattern BP2. Accordingly, the second electrode RME2 may reflect light emitted from the first light emitting element ED1 in the upward direction (Z-axis direction).

The third electrode RME3 may extend in the second direction (Y-axis direction) at the left side of the emission area EMA. The third electrode RME3 may cover an upper surface and the inclined side surfaces of the third bank pattern BP3. Accordingly, the third electrode RME3 may reflect light emitted from the second light emitting element ED2 in the upward direction (Z-axis direction).

One ends of the first to third electrodes RME1, RME2, and RME3 may be separated in units of rows by the separation parts ROP. The first to third electrodes RME1, RME2, and RME3 may be alignment electrodes for aligning the first and second light emitting elements ED1 and ED2 in processes of manufacturing the display device 10. Accordingly, the first to third electrodes RME1, RME2, and RME3 may be separated by the separation parts ROP after a process of aligning the plurality of light emitting elements ED is completed.

The first electrode RME1 of the first pixel SP1 may be connected to the first connection electrode BE1 of the third metal layer SDL through the thirty-sixth contact hole CNT36. The first electrode RME1 may receive the driving current passing through the first transistor ST1 from the first connection electrode BE1. The first electrode RME1 may supply the driving current to the plurality of first light emitting elements ED1 of the first pixel SP1.

The third electrode RME3 of the first pixel SP1 may be connected to the second voltage line VSL of the third metal layer SDL through the fortieth contact hole CNT40. Accordingly, the third electrode RME3 of the first pixel SP1 may receive the low potential voltage from the second voltage line VSL.

The first electrode RME1 of the second pixel SP2 may be connected to the fourth connection electrode BE4 of the third metal layer SDL through the thirty-seventh contact hole CNT37. The first electrode RME1 may receive the driving current passing through the first transistor ST1 from the fourth connection electrode BE4. The first electrode RME1 may supply the driving current to the plurality of first light emitting elements ED1 of the second pixel SP2.

The third electrode RME3 of the second pixel SP2 may be connected to the second voltage line VSL of the third metal layer SDL through the forty-first contact hole CNT41. Accordingly, the third electrode RME3 of the second pixel SP2 may receive the low potential voltage from the second voltage line VSL.

The first electrode RME1 of the third pixel SP3 may be connected to the seventh connection electrode BE7 of the third metal layer SDL through the thirty-eighth contact hole CNT38. The first electrode RME1 may receive the driving current passing through the first transistor ST1 from the seventh connection electrode BE7. The first electrode RME1 may supply the driving current to the plurality of first light emitting elements ED1 of the third pixel SP3.

The third electrode RME3 of the third pixel SP3 may be connected to the second voltage line VSL of the third metal layer SDL through the forty-second contact hole CNT42. Accordingly, the third electrode RME3 of the third pixel SP3 may receive the low potential voltage from the second voltage line VSL.

The cover patterns CPT may be located in the fourth electrode layer RML. The cover patterns CPT may be located on crossing points between the plurality of vertical gate lines VGL and the plurality of horizontal gate lines HGL. The cover patterns CPT may be located on a plurality of contact parts MDC and a plurality of non-contact parts NMC. For example, the cover pattern CPT located on an crossing point between the n-th vertical gate line VGLn and the n-th horizontal gate line HGLn may be located on the left side of the third electrode RME3 of the first pixel SP1. The cover pattern CPT located on an crossing point between the n+1-th vertical gate line VGLn+1 and the n-th horizontal gate line HGLn may be located on the right side of the second electrode RME2 of the third pixel SP3. The cover patterns CPT may be floated, but are not limited thereto. The cover patterns CPT may reflect at least a portion of incident light. When the cover patterns CPT do not exist, the contact part MDC and the non-contact part NMC may be recognized to be different from each other in an optical inspection. In FIG. 2, the plurality of contact parts MDC may be arranged along the diagonal direction between the first direction (X-axis direction) and the opposite direction to the second direction (Y-axis direction) in each of the first to third display areas DA1, DA2, and DA3, and unit pixel areas may have different shapes depending on positions of the contact parts MDC. The unit pixel area may include several pixel areas, but is not limited thereto. Accordingly, the cover patterns CPT are located on the plurality of contact parts MDC and the plurality of non-contact parts NMC, such that a plurality of unit pixel areas may be recognized to be the same as each other in the optical inspection. The display device may secure reliability through the optical inspection.

The plurality of first light emitting elements ED1 may be aligned between the first electrode RME1 and the second electrode RME2. The first insulating film PAS1 may cover the first to third electrodes RME1, RME2, and RME3. The first light emitting elements ED1 may be insulated from the first and second electrodes RME1 and RME2 by the first insulating film PAS1. Before the first and second electrodes RME1 and RME2 are cut by the separation part ROP, each of the first and second electrodes RME1 and RME2 may receive an alignment signal, and an electric field may be formed between the first and second electrodes RME1 and RME2. For example, the plurality of first light emitting elements ED1 may be jetted onto the first and second electrodes RME1 and RME2 through an inkjet printing process, and the plurality of first light emitting elements ED1 dispersed in ink may be aligned by receiving a dielectrophoresis force by the electric field formed between the first and second electrodes RME1 and RME2. Accordingly, the plurality of first light emitting elements ED1 may be aligned in the first direction (X-axis direction) and spaced apart along the second direction (Y-axis direction) between the first and second electrodes RME1 and RME2.

The plurality of second light emitting elements ED2 may be aligned between the first electrode RME1 and the third electrode RME3. The second light emitting elements ED2 may be insulated from the first and third electrodes RME1 and RME3 by the first insulating film PAS1. Before the first and third electrodes RME1 and RME3 are cut by the separation part ROP, each of the first and third electrodes RME1 and RME3 may receive an alignment signal, and an electric field may be formed between the first and third electrodes RME1 and RME3. For example, the plurality of second light emitting elements ED2 may be jetted onto the first and third electrodes RME1 and RME3 through an inkjet printing process, and the plurality of second light emitting elements ED2 dispersed in ink may be aligned by receiving a dielectrophoresis force by the electric field formed between the first and third electrodes RME1 and RME3. Accordingly, the plurality of second light emitting elements ED2 may be aligned in the first direction (X-axis direction) and spaced apart along the second direction (Y-axis direction) between the first and third electrodes RME1 and RME3.

The first to third contact electrodes CTE1, CTE2, and CTE3 of each of the first to third pixels SP1, SP2, and SP3 may be located on the first to third electrodes RME1, RME2, and RME3, respectively. The second insulating film PAS2 may be located on the bank layer BNL, the first insulating film PAS1, and a central portion of the light emitting element ED. The third insulating film PAS3 may cover the second insulating film PAS2 and the first to third contact electrodes CTE1, CTE2, and CTE3. The second and third insulating films PAS2 and PAS3 may insulate the first to third contact electrodes CTE1, CTE2, and CTE3 from each other.

The first contact electrode CTE1 may be located on the first electrode RME1, and may be connected to the first electrode RME1 through a forty-third contact hole CNT43. The first contact electrode CTE1 may be connected between the first electrode RME1 and one ends (e.g., first ends) of the plurality of first light emitting elements ED1. The first contact electrode CTE1 may correspond to an anode electrode of the plurality of first light emitting elements ED1, but is not limited thereto.

The second contact electrode CTE2 may be located on the first and second electrodes RME1 and RME2, and may be insulated from the first and second electrodes RME1 and RME2. A first portion of the second contact electrode CTE2 may be located on the second electrode RME2 and extend in the second direction (the Y-axis direction). A second portion of the second contact electrode CTE2 may be bent from a lower side of the first portion and extend in an opposite direction to the first direction (X-axis direction). A third portion of the second contact electrode CTE2 may be bent from a left side of the second portion and extend in the second direction (Y-axis direction), and may be located on the first electrode RME1.

The second contact electrode CTE2 may be connected between the other ends (e.g., second ends) of the plurality of first light emitting elements ED1 and one ends (e.g., first ends) of the plurality of second light emitting elements ED2. The second contact electrode CTE2 may correspond to the third node N3 of FIG. 4. The second contact electrode CTE2 may correspond to a cathode electrode of the plurality of first light emitting elements ED1, but is not limited thereto. The second contact electrode CTE2 may correspond to an anode electrode of the plurality of second light emitting elements ED2, but is not limited thereto.

The third contact electrode CTE3 may be located on the third electrode RME3, and may be connected to the third electrode RME3 through a forty-fourth contact hole CNT44. The third contact electrode CTE3 may be connected between the other ends of the plurality of second light emitting elements ED2 and the third electrode RME3. The third contact electrode CTE3 may correspond to a cathode electrode of the plurality of second light emitting elements ED2, but is not limited thereto. The third contact electrode CTE3 may receive the low potential voltage through the third electrode RME3.

A thin film transistor T1 may include an active region ACT, a gate electrode GE, a drain electrode DE, and a source electrode SE. The drain electrode DE of the thin film transistor T1 may receive the driving voltage from the first voltage line VDL of the first metal layer BML through a connection electrode BE. The source electrode SE of the thin film transistor TFT may be connected to a connection electrode BE. Here, the thin film transistor TFT may constitute a pixel circuit of each of the first to third pixels SP1, SP2, and SP3.

Figure 12:
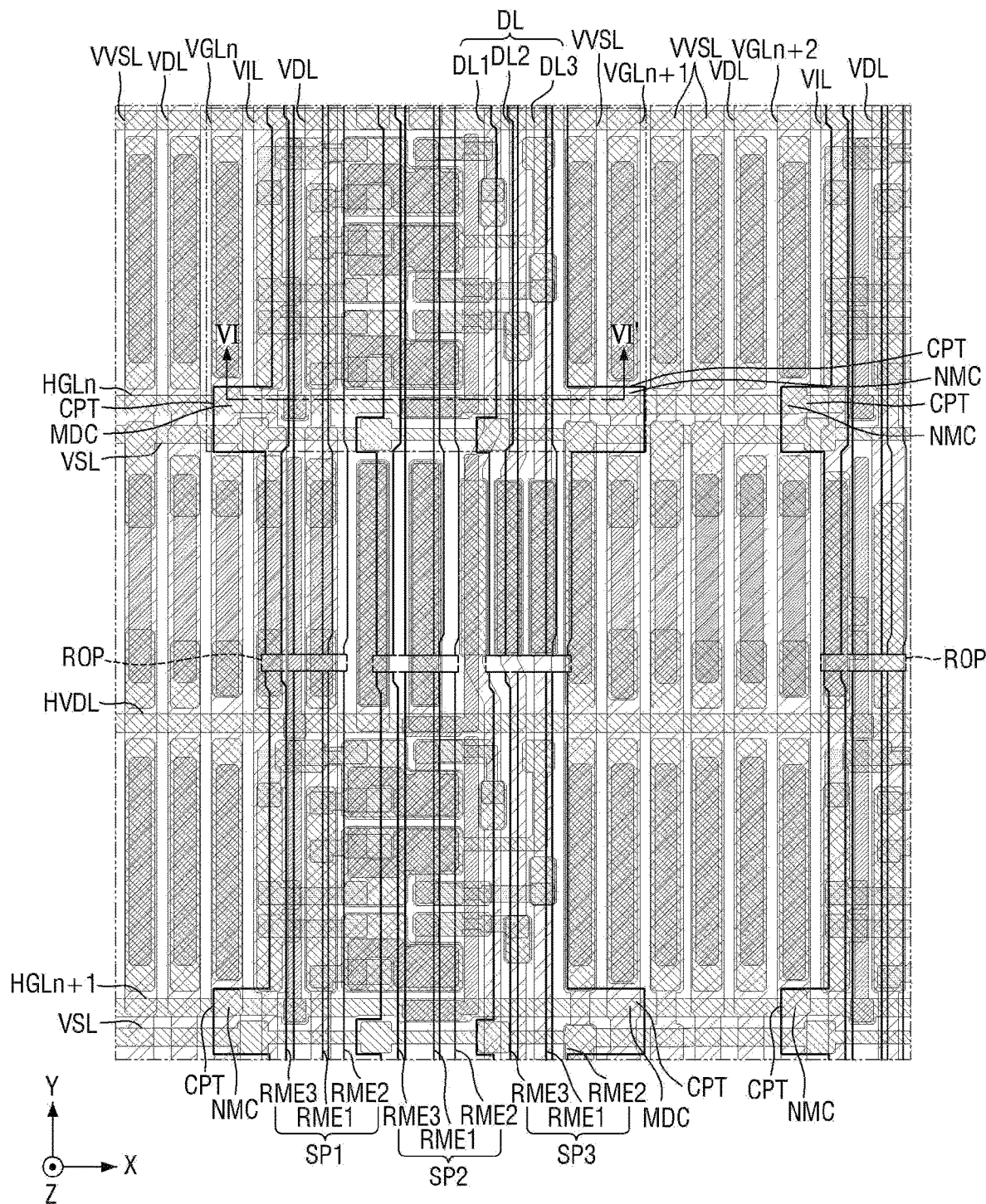
FIG. 12 is a plan view illustrating a portion of a display area in a display device according to other embodiments.
Figure 13:
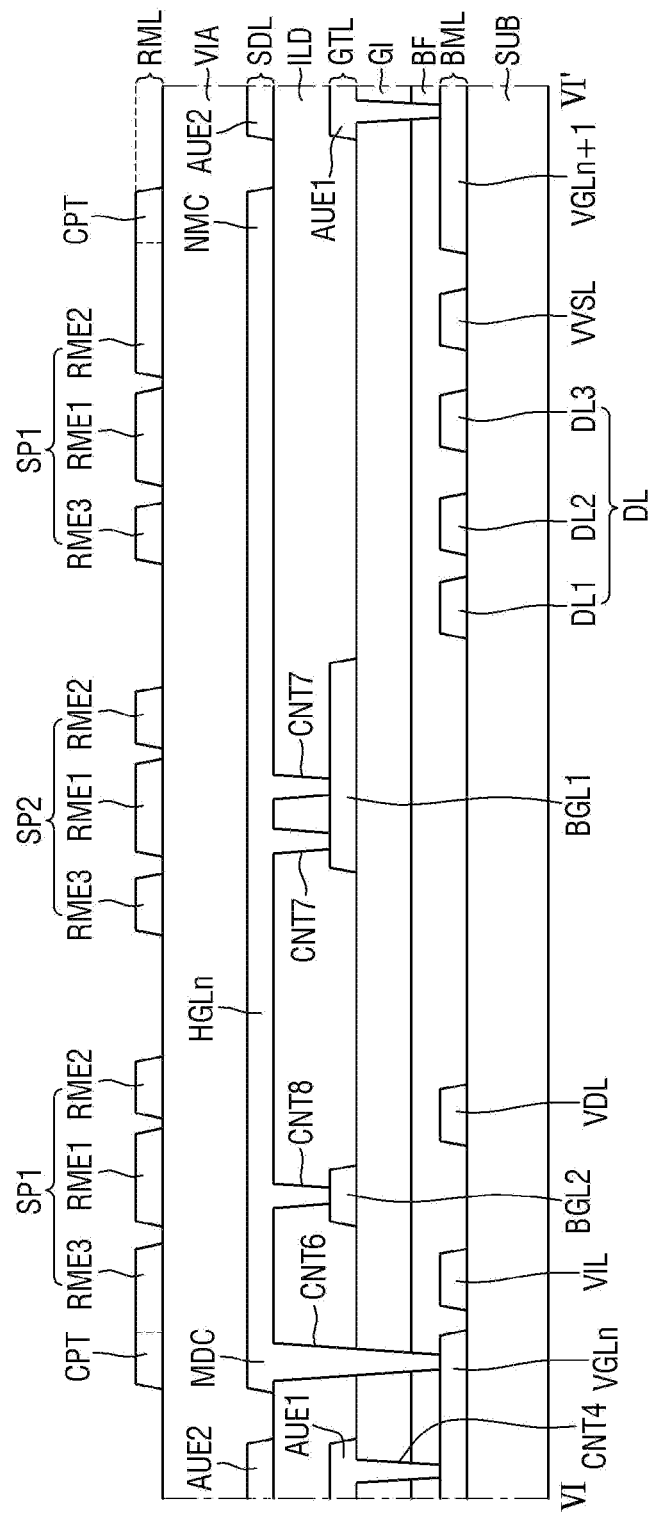
FIG. 13 is a cross-sectional view taken along the line VI-VI' of FIG. 12.
Figure 14:
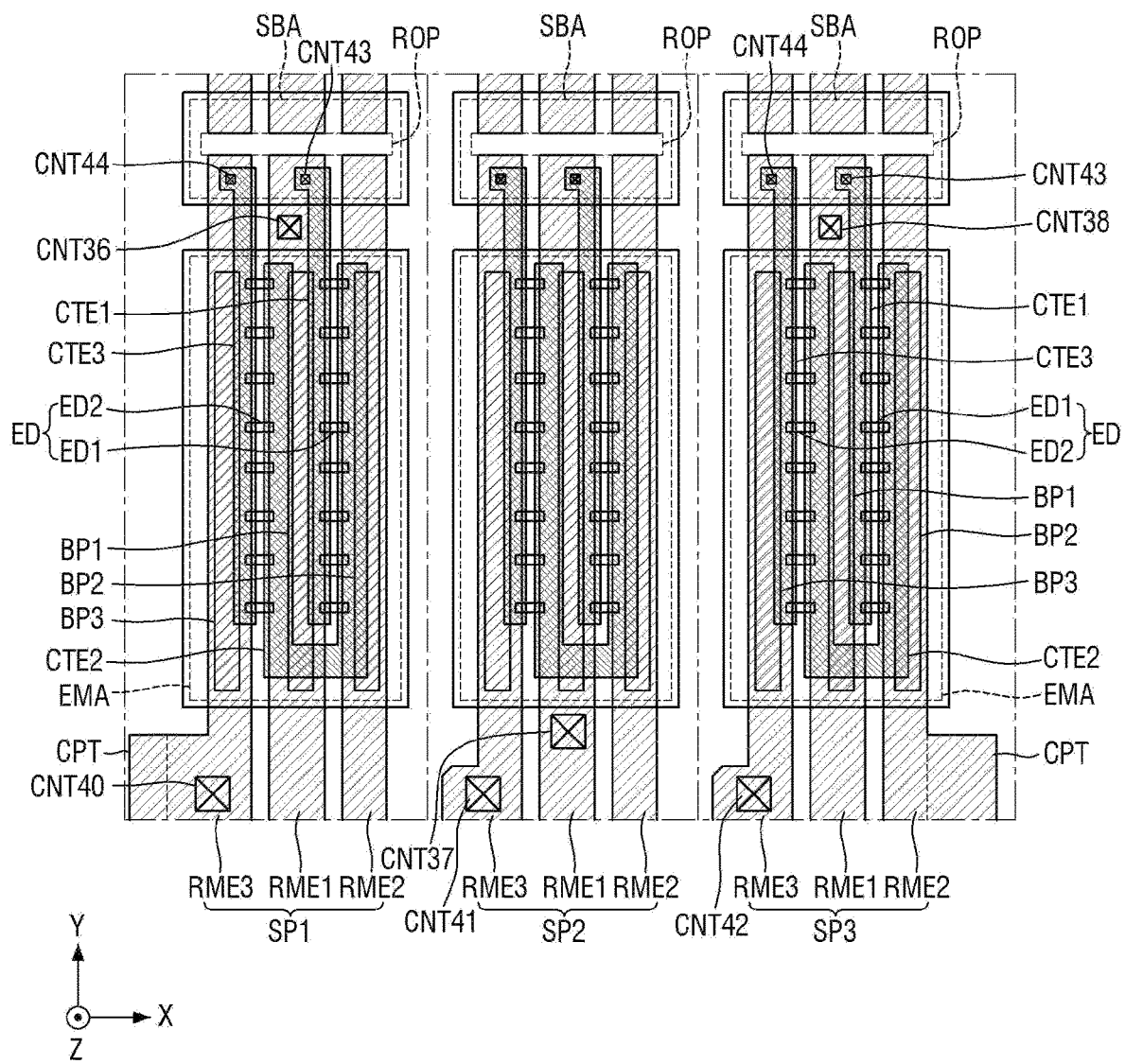
FIG. 14 is a plan view illustrating a light emitting element layer of the display device according to other embodiments.

FIG. 12 is a plan view illustrating a portion of a display area in a display device according to other embodiments, FIG. 13 is a cross-sectional view taken along the line VI-VI' of FIG. 12, and FIG. 14 is a plan view illustrating a light emitting element layer of the display device according to other embodiments. A display device of FIGS. 12 to 14 is different in configurations of cover patterns CPT from the display device of FIGS. 5 to 11, and the same configurations as the configurations described above will be briefly described or a repeated description thereof will be omitted.

Referring to FIGS. 12 to 14, the first to third electrodes RME1, RME2, and RME3 of each of the first to third pixels SP1, SP2, and SP3 may be located in the fourth electrode layer RML. The first to third electrodes RME1, RME2, and RME3 of the first pixel SP1 may be located on the left side of the pixel area, the first to third electrodes RME1, RME2, and RME3 of the second pixel SP2 may be located at the center of the pixel area, and the first to third electrodes RME1, RME2, and RME3 of the third pixel SP3 may be located on the right side of the pixel area. The first electrode RME1 of each of the first to third pixels SP1, SP2, and SP3 may be located between the respective second and third electrodes RME2 and RME3, the second electrode RME2 of each of the first to third pixels SP1, SP2, and SP3 may be located on the right side of the respective first electrode RME1, and the third electrode RME3 of each of the first to third pixels SP1, SP2, and SP3 may be located on the left side of the respective first electrode RME1.

The third electrode RME3 of the first pixel SP1 may include a cover pattern CPT. The cover pattern CPT may protrude from the third electrode RME3 of the first pixel SP1 in an opposite direction to the first direction (X-axis direction). The cover patterns CPT may be located on crossing points between the plurality of vertical gate lines VGL and the plurality of horizontal gate lines HGL. The cover patterns CPT may be located on a plurality of contact parts MDC and a plurality of non-contact parts NMC. For example, the cover pattern CPT located on an crossing point between the n-th vertical gate line VGLn and the n-th horizontal gate line HGLn may protrude to the left side of the third electrode RME3 of the first pixel SP1.

The second electrode RME2 of the third pixel SP3 may include a cover pattern CPT. The cover pattern CPT may protrude from the second electrode RME2 of the third pixel SP3 in the first direction (X-axis direction). The cover patterns CPT may be located on crossing points between the plurality of vertical gate lines VGL and the plurality of horizontal gate lines HGL. The cover patterns CPT may be located on a plurality of contact parts MDC and a plurality of non-contact parts NMC. For example, the cover pattern CPT located on a crossing point between the n+1-th vertical gate line VGLn+1 and the n-th horizontal gate line HGLn may protrude to the right side of the second electrode RME2 of the third pixel SP3. The cover patterns CPT may reflect at least a portion of incident light.

When the cover patterns CPT do not exist, the contact part MDC and the non-contact part NMC may be recognized to be different from each other in an optical inspection. In FIG. 2, the plurality of contact parts MDC may be arranged along the diagonal direction between the first direction (X-axis direction) and the opposite direction to the second direction (Y-axis direction) in each of the first to third display areas DA1, DA2, and DA3, and unit pixel areas may have different shapes depending on positions of the contact parts MDC. The unit pixel area may include several pixel areas, but is not limited thereto. Accordingly, the cover patterns CPT are located on the plurality of contact parts MDC and the plurality of non-contact parts NMC, such that a plurality of unit pixel areas may be recognized to be the same as each other in the optical inspection. The display device may secure reliability through the optical inspection.

The cover patterns CPT are formed integrally with the third electrode RME3 of the first pixel SP1 and with the second electrode RME2 of the third pixel SP3, such that generation of static electricity may be reduced or prevented and the possibility of loss or separation of the cover pattern CPT may be reduced or prevented.

Figure 15:
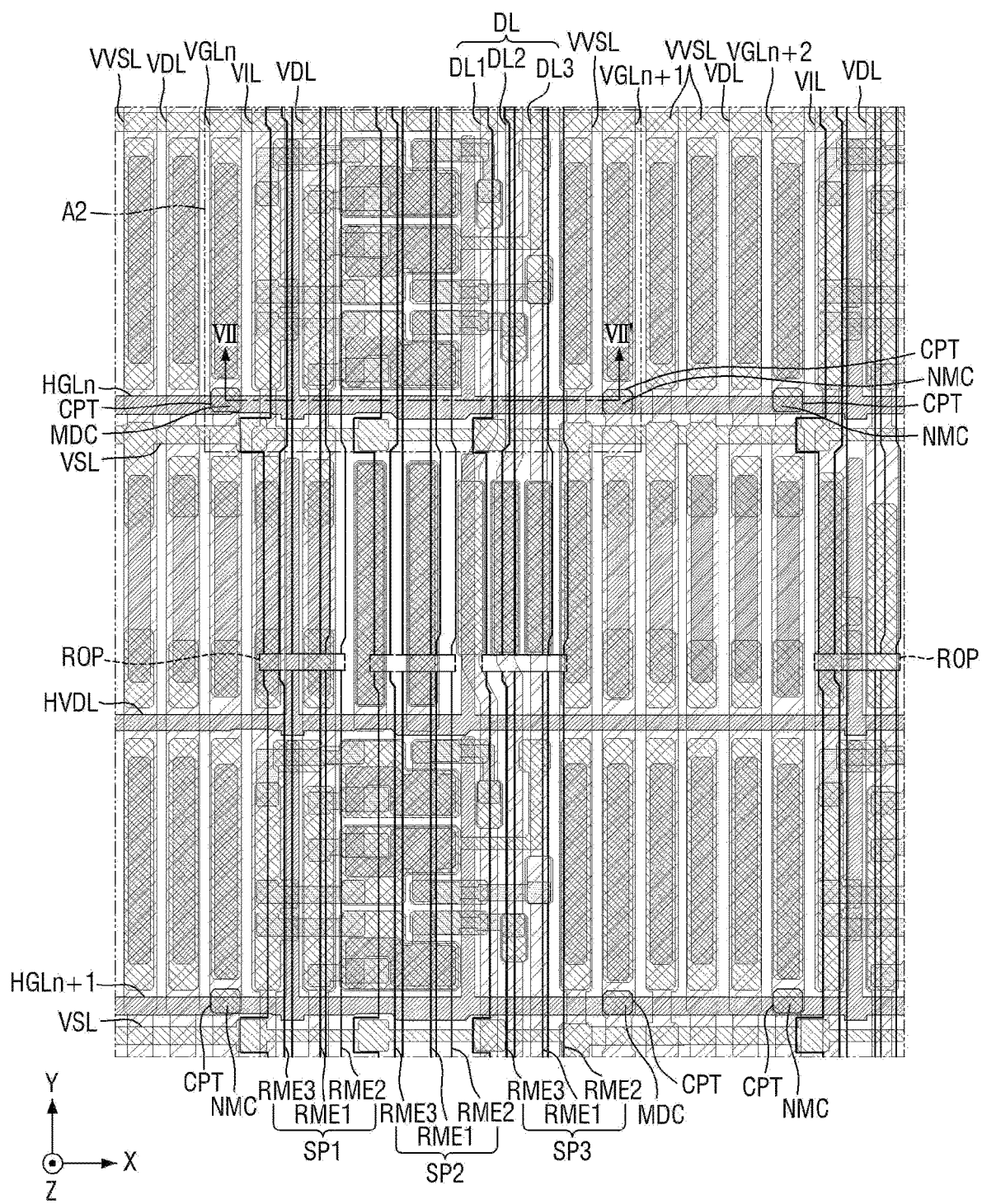
FIG. 15 is a plan view illustrating a portion of a display area in a display device according to still other embodiments.
Figure 16:
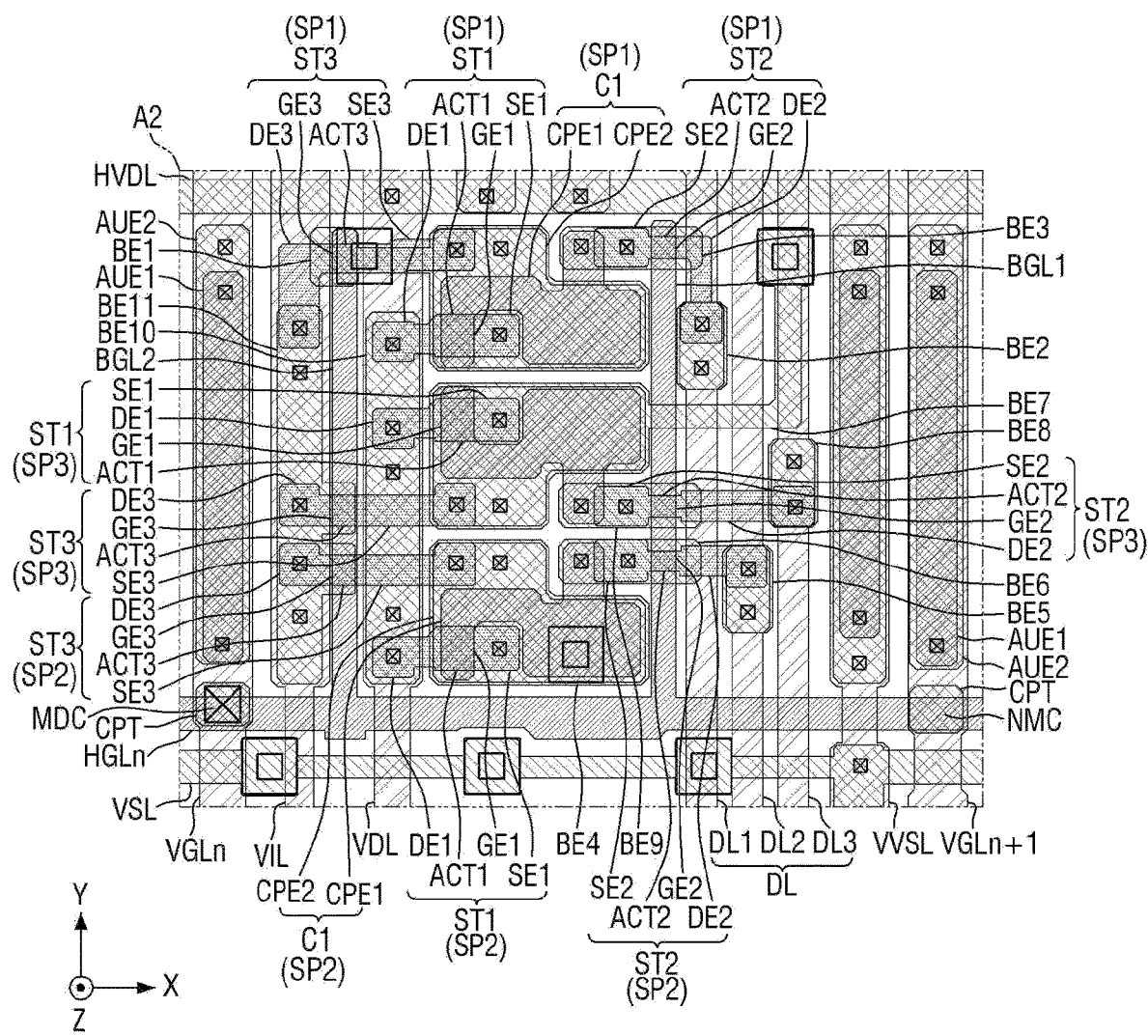
FIGS. 16 and 17 are enlarged views illustrating a thin film transistor layer in area A2 of FIG. 15.
Figure 17:
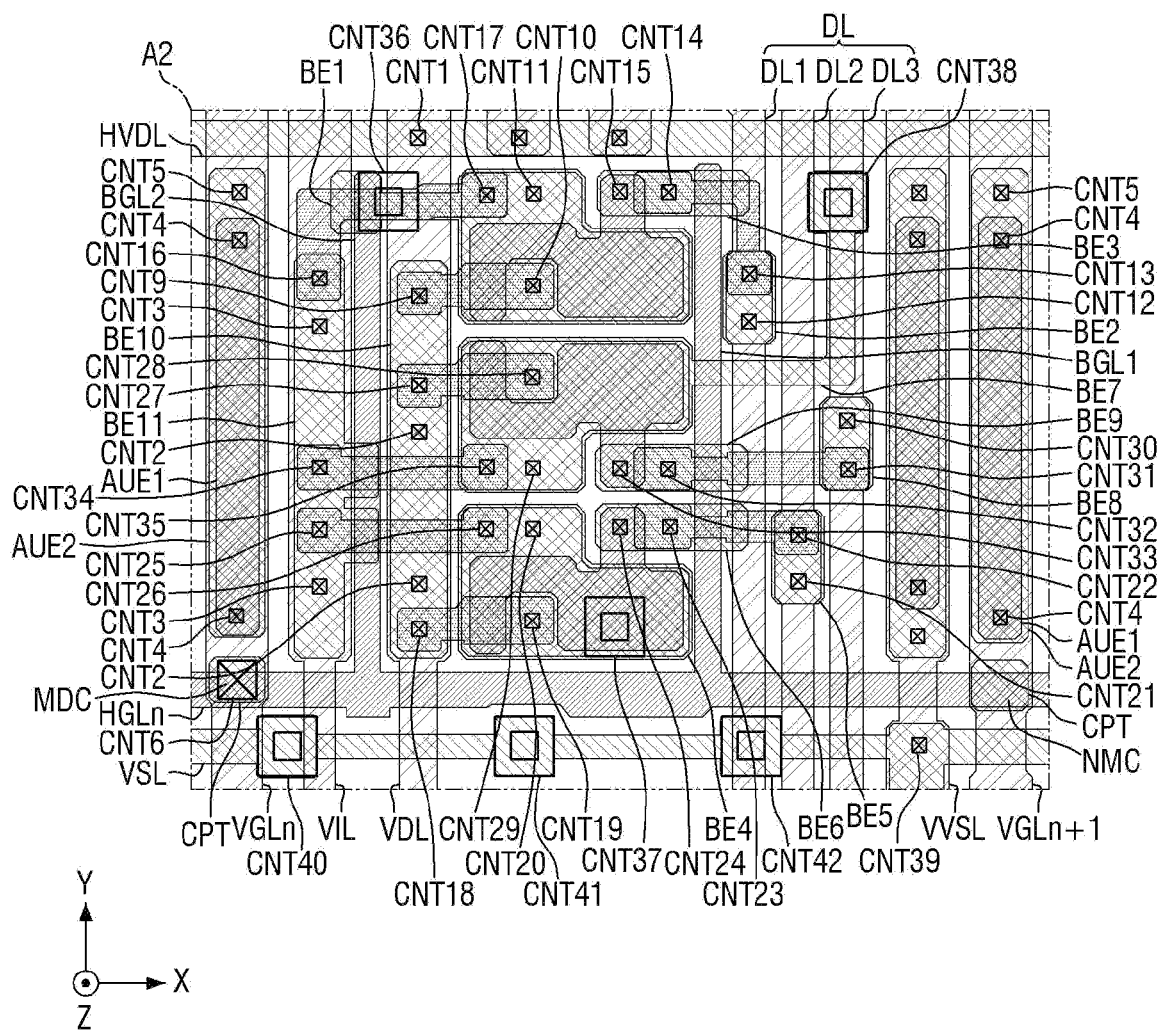
Figure 18:
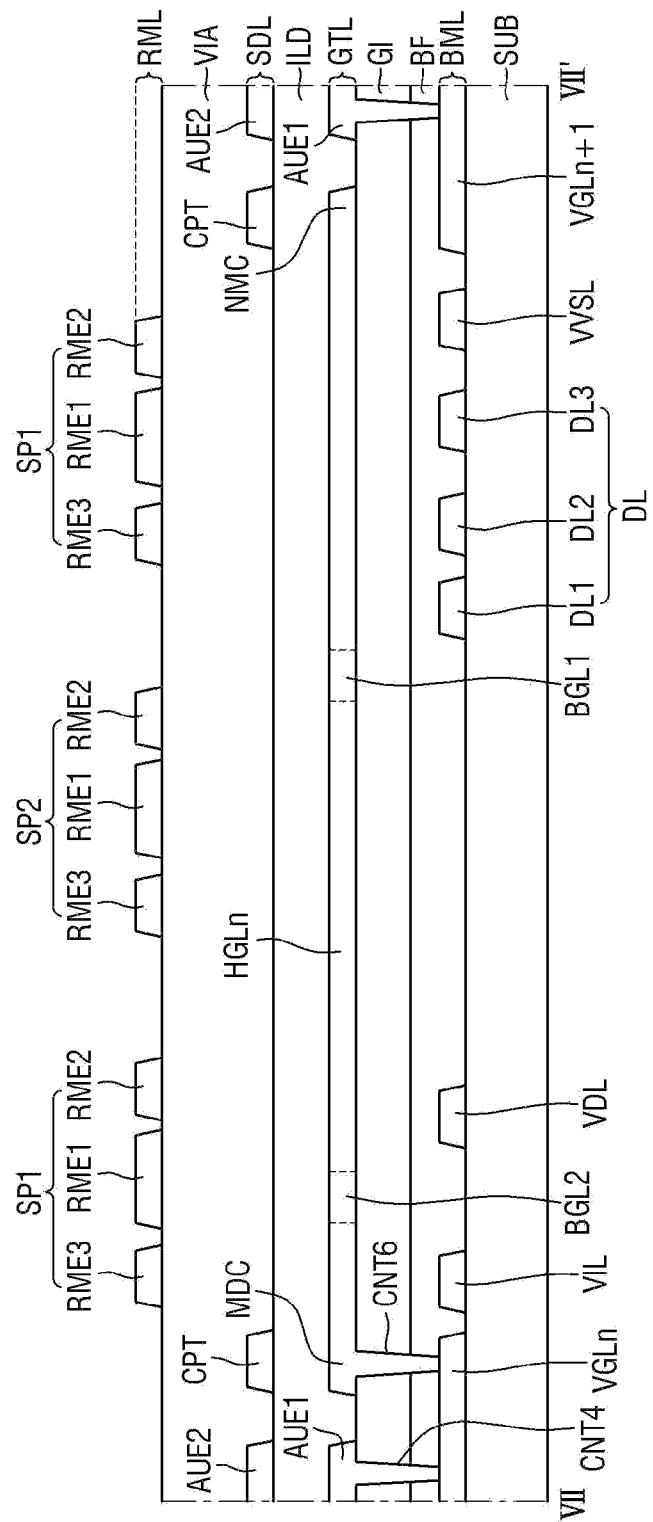
FIG. 18 is a cross-sectional view taken along the line VII-VII' of FIG. 15.

FIG. 15 is a plan view illustrating a portion of a display area in a display device according to still other embodiments, FIGS. 16 and 17 are enlarged views illustrating a thin film transistor layer in area A2 of FIG. 15, and FIG. 18 is a cross-sectional view taken along the line VII-VII' of FIG. 15. A display device of FIGS. 15 to 18 is different in configurations of horizontal gate lines HGL and cover patterns CPT from the display device of FIGS. 5 to 11, and the same configurations as the configurations described above will be briefly described or a description therefor will be omitted.

Referring to FIGS. 15 to 18, the gate line GL may include a vertical gate line VGL, a horizontal gate line HGL, and first and second auxiliary gate lines BGL1 and BGL2.

The plurality of vertical gate lines VGL may extend in the second direction (Y-axis direction). The vertical gate line VGL may be located on one side (e.g., the left side) of the initialization voltage line VIL. The vertical gate line VGL may be located in the first metal layer BML. The vertical gate line VGL may be connected between the display driver 220 and the horizontal gate line HGL. The plurality of vertical gate lines VGL may cross the plurality of horizontal gate lines HGL, respectively. The vertical gate lines VGL may supply the gate signals received from the display drivers 220 to the horizontal gate lines HGL.

The horizontal gate lines HGL may extend in the first direction (X-axis direction). The horizontal gate line HGL may be located on the lower side of the pixel circuit of the second pixel SP2. The horizontal gate line HGL may be located in the second metal layer GTL. The horizontal gate line HGL may be connected between, or connected to, the vertical gate line VGL and the first and second auxiliary gate lines BGL1 and BGL2. The horizontal gate line HGL may be formed integrally with the first and second auxiliary gate lines BGL1 and BGL2. The horizontal gate line HGL may supply the gate signal received from the vertical gate line VGL to the first and second auxiliary gate lines BGL1 and BGL2. The horizontal gate line HGL may be formed integrally with the first and second auxiliary gate lines BGL1 and BGL2, such that the number of contact holes may be reduced and such that the gate signal may be easily supplied to the first and second auxiliary gate lines BGL1 and BGL2.

The n-th horizontal gate line HGLn may be located in the second metal layer GTL. The n-th horizontal gate line HGLn may be located on the lower side of the pixel circuit of the second pixel SP2. The n-th horizontal gate line HGLn may be connected to the n-th vertical gate line VGLn through the contact part MDC. The contact part MDC may correspond to a portion where the n-th horizontal gate line HGLn is inserted into, or connected to a material within, the sixth contact hole CNT6 to come into contact (e.g., electrical contact) with the n-th vertical gate line VGLn. The n-th horizontal gate line HGLn may supply the gate signal received from the n-th vertical gate line VGLn to the first and second auxiliary gate lines BGL1 and BGL2.

The first and second auxiliary gate lines BGL1 and BGL2 may be located in the second metal layer GTL. The first and second auxiliary gate lines BGL1 and BGL2 may be formed integrally with the n-th horizontal gate line HGLn. Each of the first and second auxiliary gate lines BGL1 and BGL2 may extend from the n-th horizontal gate line HGLn in the second direction (Y-axis direction). The first auxiliary gate line BGL1 may be located on the other side (e.g., the right side) of the pixel circuits of the first to third pixels SP1, SP2, and SP3. The first auxiliary gate line BGL1 may supply a gate signal received from the n-th horizontal gate line HGLn to second transistors ST2 of the first to third pixels SP1, SP2, and SP3. The second auxiliary gate line BGL2 may be located between the initialization voltage line VIL and the first voltage line VDL. The second auxiliary gate line BGL2 may supply a gate signal received from the n-th horizontal gate line HGLn to the third transistors ST3 of the first to third pixels SP1, SP2, and SP3.

The cover patterns CPT may be located in the third electrode layer SDL. The cover patterns CPT may be located on crossing points between the plurality of vertical gate lines VGL and the plurality of horizontal gate lines HGL. The cover patterns CPT may be located on a plurality of contact parts MDC and a plurality of non-contact parts NMC. For example, the cover pattern CPT located on an crossing point between the n-th vertical gate line VGLn and the n-th horizontal gate line HGLn may be located between the second auxiliary electrode AUE2 connected to the n-th vertical gate line VGLn and the second voltage line VSL. The cover pattern CPT located on an crossing point between the n+1-th vertical gate line VGLn+1 and the n-th horizontal gate line HGLn may be located between the second auxiliary electrode AUE2 connected to the n+1-th vertical gate line VGLn+1 and the second voltage line VSL. The cover patterns CPT may be floated, but are not limited thereto. The cover patterns CPT may reflect at least a portion of incident light. When the cover patterns CPT do not exist, the contact part MDC and the non-contact part NMC may be recognized to be different from each other in an optical inspection. In FIG. 2, the plurality of contact parts MDC may be arranged along the diagonal direction between the first direction (X-axis direction) and the opposite direction to the second direction (Y-axis direction) in each of the first to third display areas DA1, DA2, and DA3, and unit pixel areas may have different shapes depending on positions of the contact parts MDC. The unit pixel area may include several pixel areas, but is not limited thereto. Accordingly, the cover patterns CPT are located on the plurality of contact parts MDC and the plurality of non-contact parts NMC, such that a plurality of unit pixel areas may be recognized to be the same as each other in the optical inspection. The display device may secure reliability through the optical inspection.

Figure 19:
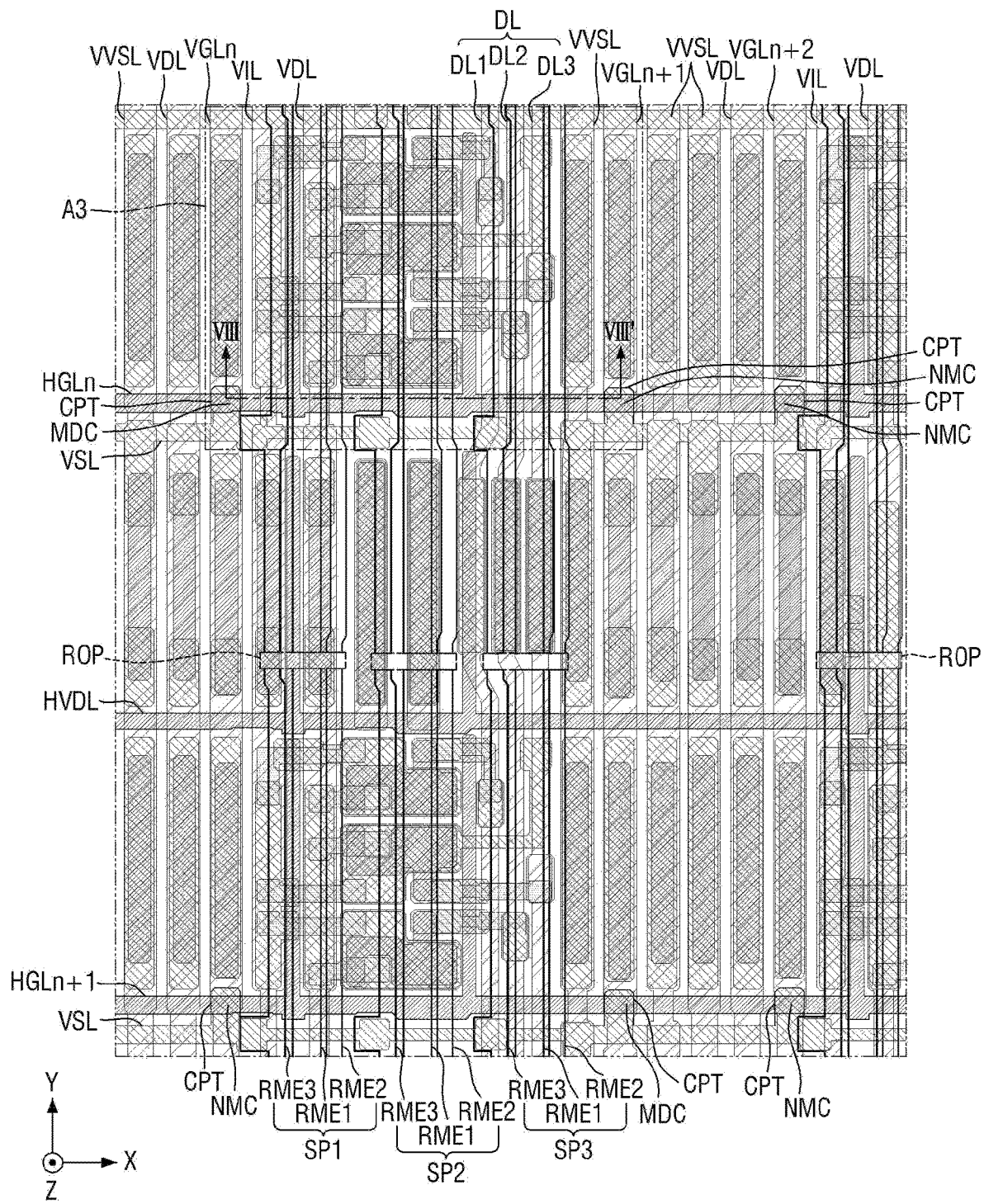
FIG. 19 is a plan view illustrating a portion of a display area in a display device according to still other embodiments.
Figure 20:
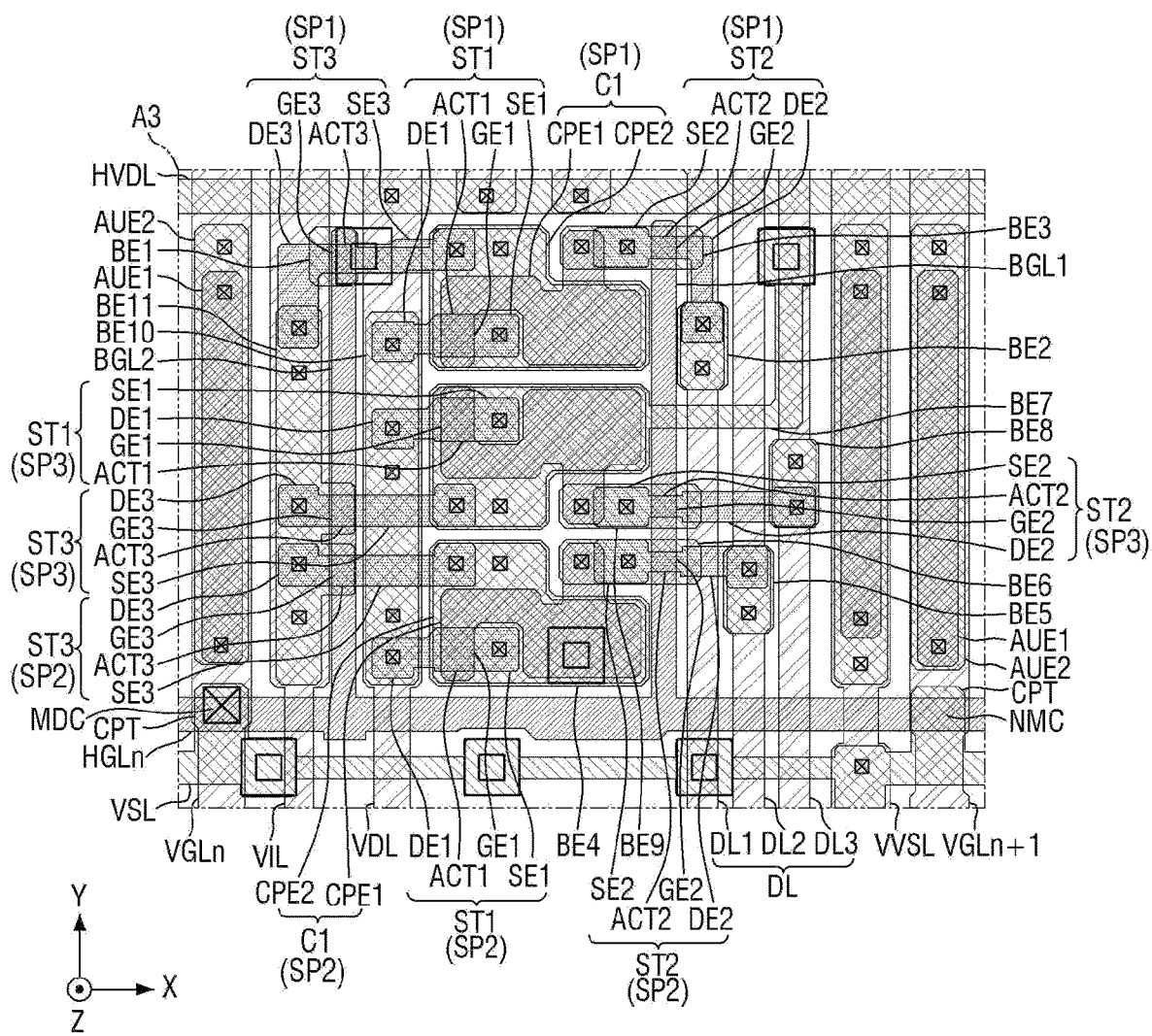
FIGS. 20 and 21 are enlarged views illustrating a thin film transistor layer in area A3 of FIG. 19.
Figure 21:
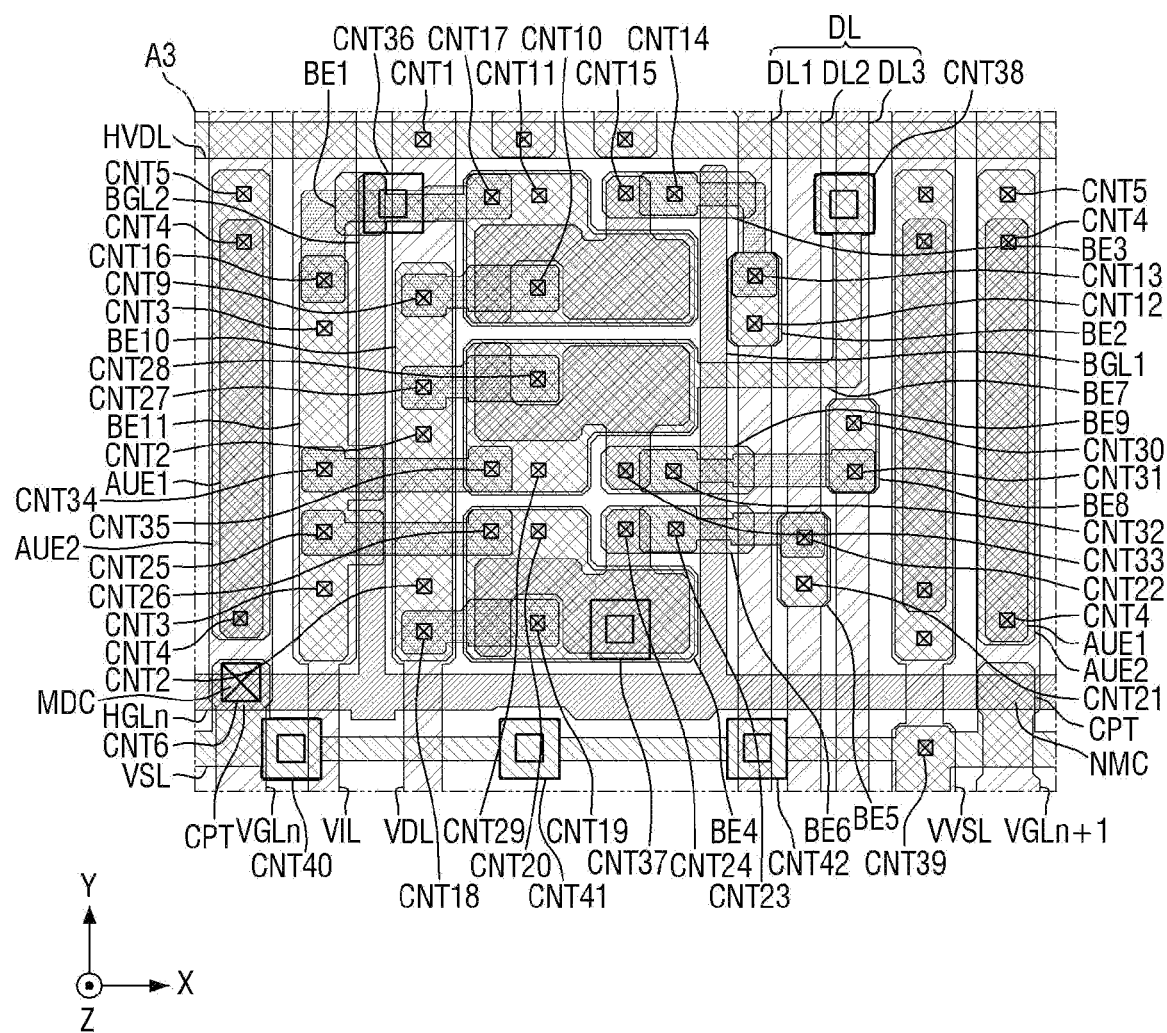
Figure 22:
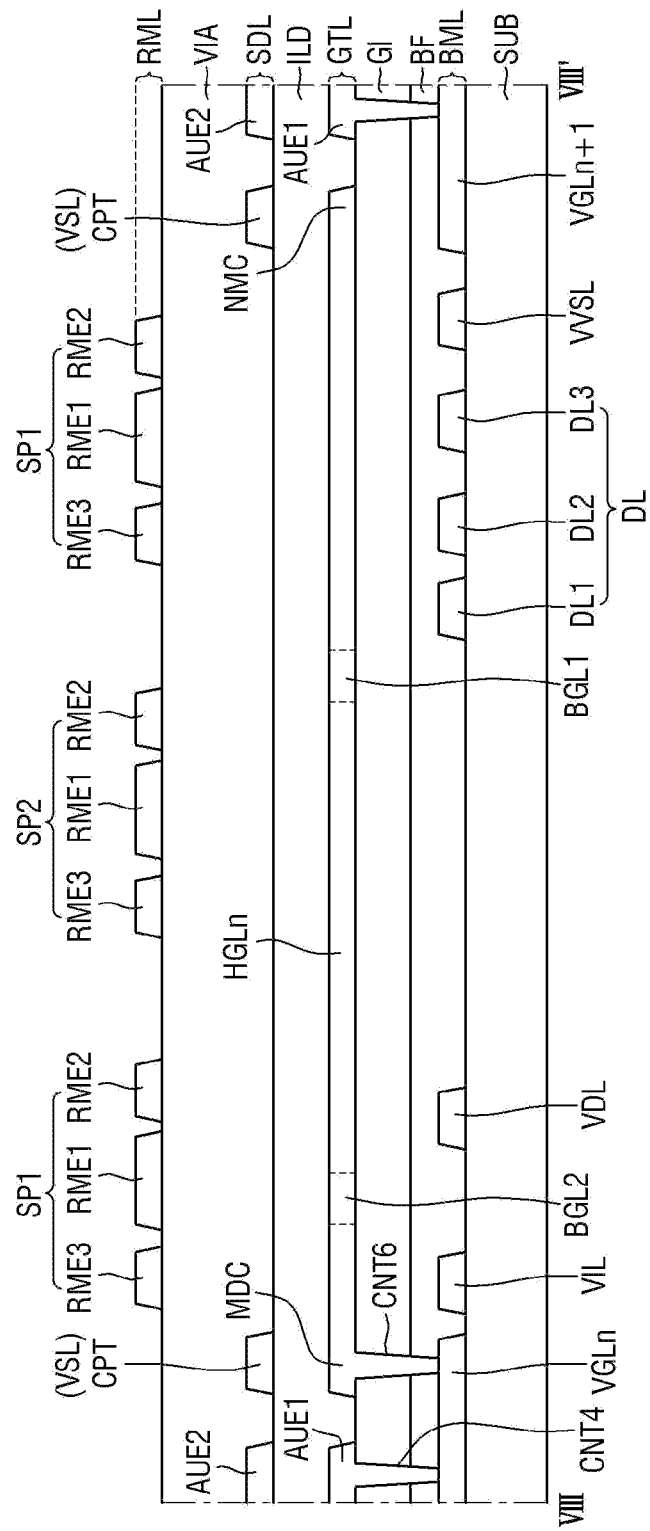
FIG. 22 is a cross-sectional view taken along the line VIII-VIII' of FIG. 19.

FIG. 19 is a plan view illustrating a portion of a display area in a display device according to still other embodiments, FIGS. 20 and 21 are enlarged views illustrating a thin film transistor layer in area A3 of FIG. 19, and FIG. 22 is a cross-sectional view taken along the line VIII-VIII' of FIG. 19. A display device of FIGS. 19 to 22 is different in configurations of cover patterns CPT from the display device of FIGS. 15 to 18, and the same configurations as the configurations described above will be briefly described or a repeated description thereof will be omitted.

Referring to FIGS. 19 to 22, the n-th horizontal gate line HGLn may be located in the second metal layer GTL. The n-th horizontal gate line HGLn may be located on the lower side of the pixel circuit of the second pixel SP2. The n-th horizontal gate line HGLn may be connected to the n-th vertical gate line VGLn through the contact part MDC. The contact part MDC may correspond to a portion where the n-th horizontal gate line HGLn is inserted into, or connected or electrically connected through, the sixth contact hole CNT6 to come into contact (e.g., electrically connected) with the n-th vertical gate line VGLn. The first and second auxiliary gate lines BGL1 and BGL2 may be formed integrally with the n-th horizontal gate line HGLn. The n-th horizontal gate line HGLn may supply the gate signal received from the n-th vertical gate line VGLn to the first and second auxiliary gate lines BGL1 and BGL2.

The second voltage line VSL may be located in the third metal layer SDL. The second voltage line VSL may be located on the lower side of the n-th horizontal gate line HGLn. The second voltage line VSL may supply the low potential voltage received from the vertical voltage line VVSL to third electrodes RME3 of each of the first to third pixels SP1, SP2, and SP3. For example, the second voltage line VSL may be connected to the third electrode RME3 of the first pixel SP1 through the fortieth contact hole CNT40. The second voltage line VSL may be connected to the third electrode RME3 of the second pixel SP2 through the forty-first contact hole CNT41. The second voltage line VSL may be connected to the third electrode RME3 of the third pixel SP3 through the forty-second contact hole CNT42. Here, the third electrodes RME3 of each of the first to third pixels SP1, SP2, and SP3 may be located in the fourth electrode layer RML, and the fortieth to forty-second contact holes CNT40, CNT41, and CNT42 may be formed to penetrate through the via layer VIA.

The second voltage line VSL may include the cover patterns CPT. The cover pattern CPT may protrude from the second voltage line VSL in the second direction (Y-axis direction). The cover patterns CPT may be located on crossing points between the plurality of vertical gate lines VGL and the plurality of horizontal gate lines HGL. The cover patterns CPT may be located on a plurality of contact parts MDC and a plurality of non-contact parts NMC. For example, the cover pattern CPT located on an crossing point between the n-th vertical gate line VGLn and the n-th horizontal gate line HGLn may protrude to the upper side of the second voltage line VSL. The cover patterns CPT may reflect at least a portion of incident light.

When the cover patterns CPT do not exist, the contact part MDC and the non-contact part NMC may be recognized to be different from each other in an optical inspection. In FIG. 2, the plurality of contact parts MDC may be arranged along the diagonal direction between the first direction (X-axis direction) and the opposite direction to the second direction (Y-axis direction) in each of the first to third display areas DA1, DA2, and DA3, and unit pixel areas may have different shapes depending on positions of the contact parts MDC. The unit pixel area may include several pixel areas, but is not limited thereto. Accordingly, the cover patterns CPT are located on the plurality of contact parts MDC and the plurality of non-contact parts NMC, such that a plurality of unit pixel areas may be recognized to be the same as each other in the optical inspection. The display device may secure reliability through the optical inspection. The cover pattern CPT is formed integrally with the second voltage line VSL, such that generation of static electricity may be reduced or prevented and the possibility of loss or separation of the cover pattern CPT may be reduced or prevented.

What is claimed is:

1. A display device comprising:
a substrate;
data lines on the substrate, and extending in a first direction;
first gate lines at a same layer as the data lines, and extending in the first direction;
second gate lines on the first gate lines, and extending in a second direction crossing the first direction; and
cover patterns on the second gate lines, floated, and covering crossing points between the first gate lines and the second gate lines.

2. The display device of claim 1, wherein the cover patterns have a shape of islands spaced from each other in the first direction and the second direction.

3. The display device of claim 1, wherein the second gate lines are connected to respective first gate lines through respective contact parts, and are insulated from others of the first gate lines by non-contact parts, and
wherein the cover patterns overlap the contact parts and the non-contact parts in a thickness direction.

4. The display device of claim 1, further comprising a gate electrode in a layer between the first gate lines and the second gate lines.

5. The display device of claim 4, further comprising first and second electrodes at a same layer as the cover patterns, and extending in the first direction.

6. The display device of claim 5, wherein the first and second electrodes are spaced apart from the first gate lines in plan view.

7. The display device of claim 5, further comprising first light emitting elements aligned between the first and second electrodes.

8. The display device of claim 7, further comprising:
a first contact electrode connected between the first electrode and first ends of the first light emitting elements; and
a second contact electrode connected between the second electrode and second ends of the first light emitting elements.

9. The display device of claim 1, further comprising a gate electrode at a same layer as the second gate lines.

10. The display device of claim 9, further comprising first and second electrodes on the cover patterns and extending in the first direction.

11. The display device of claim 1, further comprising:
pixel circuits of pixels respectively connected to the data lines and the second gate lines; and
first voltage lines, initialization voltage lines, and first light emitting elements respectively connected to the pixel circuits.

12. The display device of claim 11, wherein the pixel circuits comprise:
first transistors respectively connected between the first voltage lines and the first light emitting elements, and configured to supply a driving current to the first light emitting elements;
second transistors configured to respectively connect the data lines to first nodes comprising gate electrodes of the first transistors based on a gate signal of the second gate lines; and
third transistors configured to respectively connecting the initialization voltage lines to second nodes comprising source electrodes of the first transistors based on the gate signal.

13. A display device comprising:
a substrate;
data lines on the substrate, and extending in a first direction;
first gate lines at a same layer as the data lines, and extending in the first direction;
second gate lines on the first gate lines, and extending in a second direction crossing the first direction;
first and second electrodes on the second gate lines, and extending in the first direction; and
first light emitting elements aligned between the first and second electrodes,
wherein at least one of the first and second electrodes comprises cover patterns covering crossing points between the first gate lines and the second gate lines.

14. The display device of claim 13, wherein the cover patterns protrude from the first electrode or the second electrode in the second direction.

15. The display device of claim 13, wherein the second gate lines are respectively connected to the first gate lines through a contact part, and are insulated from others of the first gate lines by non-contact parts, and
wherein the cover patterns overlap the contact parts and the non-contact parts in a thickness direction.

16. The display device of claim 13, wherein a portion of the first electrode or the second electrode excluding the cover patterns is spaced from the first gate lines in plan view.

17. The display device of claim 13, further comprising a gate electrode at a layer between the first gate lines and the second gate lines.

* * * * *